US012751284B2

(12) United States Patent
Chen et al.

(10) Patent No.: US 12,751,284 B2
(45) Date of Patent: Sep. 29, 2026

(54) INTERCONNECT DESIGN OF A THIN FILM RESISTOR

(71) Applicant: Taiwan Semiconductor Manufacturing Company, Ltd., Hsinchu (TW)

(72) Inventors: Chun-Heng Chen, Hsinchu City (TW); Liang-Yi Chang, Hsinchu City (TW); Yu-Wei Liang, Kaohsiung City (TW); Chang-Yu Huang, Hsinchu (TW); Hung-Han Lin, Hsinchu City (TW); Ru-Shang Hsiao, Jhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 718 days.

(21) Appl. No.: 18/304,755

(22) Filed: Apr. 21, 2023

(65) Prior Publication Data

US 2024/0355729 A1 Oct. 24, 2024

(51) Int. Cl.
*H10W 20/40* (2026.01)
*H10W 20/42* (2026.01)

(52) U.S. Cl.
CPC ......... *H10W 20/498* (2026.01); *H10W 20/42* (2026.01)

(58) Field of Classification Search
CPC ........... H01L 23/5228; H01L 23/5226; H10W 20/498; H10W 20/42
See application file for complete search history.

(56) References Cited

U.S. PATENT DOCUMENTS

| | | | | |
|---|---|---|---|---|
| 7,217,981 | B2 * | 5/2007 | Coolbaugh | H10D 1/47 257/E21.004 |
| 9,111,768 | B2 | 8/2015 | Lu et al. | |
| 9,673,144 | B2 * | 6/2017 | Nishimura | H01L 23/5258 |
| 9,905,633 | B1 * | 2/2018 | Yang | H01L 21/76816 |
| 11,114,222 | B2 * | 9/2021 | Karino | H01C 7/00 |
| 12,414,312 | B2 * | 9/2025 | Li | H10D 1/474 |
| 2010/0308436 | A1 * | 12/2010 | Nanjo | H10D 1/47 257/536 |
| 2019/0181089 | A1 * | 6/2019 | Karino | H10D 1/476 |
| 2020/0395151 | A1 * | 12/2020 | Karino | H01C 1/142 |
| 2021/0134940 | A1 * | 5/2021 | Kuo | H10D 1/474 |
| 2023/0046455 | A1 * | 2/2023 | Wong | H10D 1/474 |
| 2023/0145327 | A1 * | 5/2023 | Chang | H10D 1/47 257/211 |

(Continued)

FOREIGN PATENT DOCUMENTS

CN 112234142 A 1/2021

*Primary Examiner* — Kyung S Lee
(74) *Attorney, Agent, or Firm* — Harrity & Harrity, LLP

(57) ABSTRACT

Some implementations described herein include techniques and apparatus for forming a semiconductor device including a semiconductor resistor structure. The semiconductor resistor structure (e.g., a low-impedance thin-film resistor structure) may include a resistive layer having an approximately rectangular shape (e.g., a width-to-length ratio that is less than approximately one). The semiconductor resistor structure includes contact structures connected to the resistive layer, a conductive bus structure having an approximately rectangular shape that connects to the contact structures, and an electrical terminal (e.g., a routing pin) centrally located at or near an edge of the conductive bus structure.

20 Claims, 19 Drawing Sheets

(56) References Cited

U.S. PATENT DOCUMENTS

| | | | | |
|---|---|---|---|---|
| 2023/0197606 | A1* | 6/2023 | Li | H10D 1/474<br>257/536 |
| 2023/0207381 | A1* | 6/2023 | Nian | H01L 21/02323<br>257/506 |
| 2023/0335488 | A1* | 10/2023 | Hsiao | H10D 1/474 |
| 2023/0343700 | A1* | 10/2023 | Shiraishi | H01L 25/0655 |
| 2025/0203885 | A1* | 6/2025 | Cheng | H10D 1/47 |

* cited by examiner

INTERCONNECT DESIGN OF A THIN FILM RESISTOR

BACKGROUND

Semiconductor-based integrated circuits may include a wide range of semiconductor devices. These semiconductor devices may include active semiconductor devices and/or passive semiconductor devices. Active semiconductor devices may include transistors and other semiconductor devices that operate using a power source. Passive semiconductor devices include inductors, capacitors, resistors, and/or other semiconductor devices that can operate without a power source. Resistors are widely used in many applications, such as resistor-capacitor (RC) circuits, power drivers, power amplifiers, and/or radio frequency (RF) applications, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
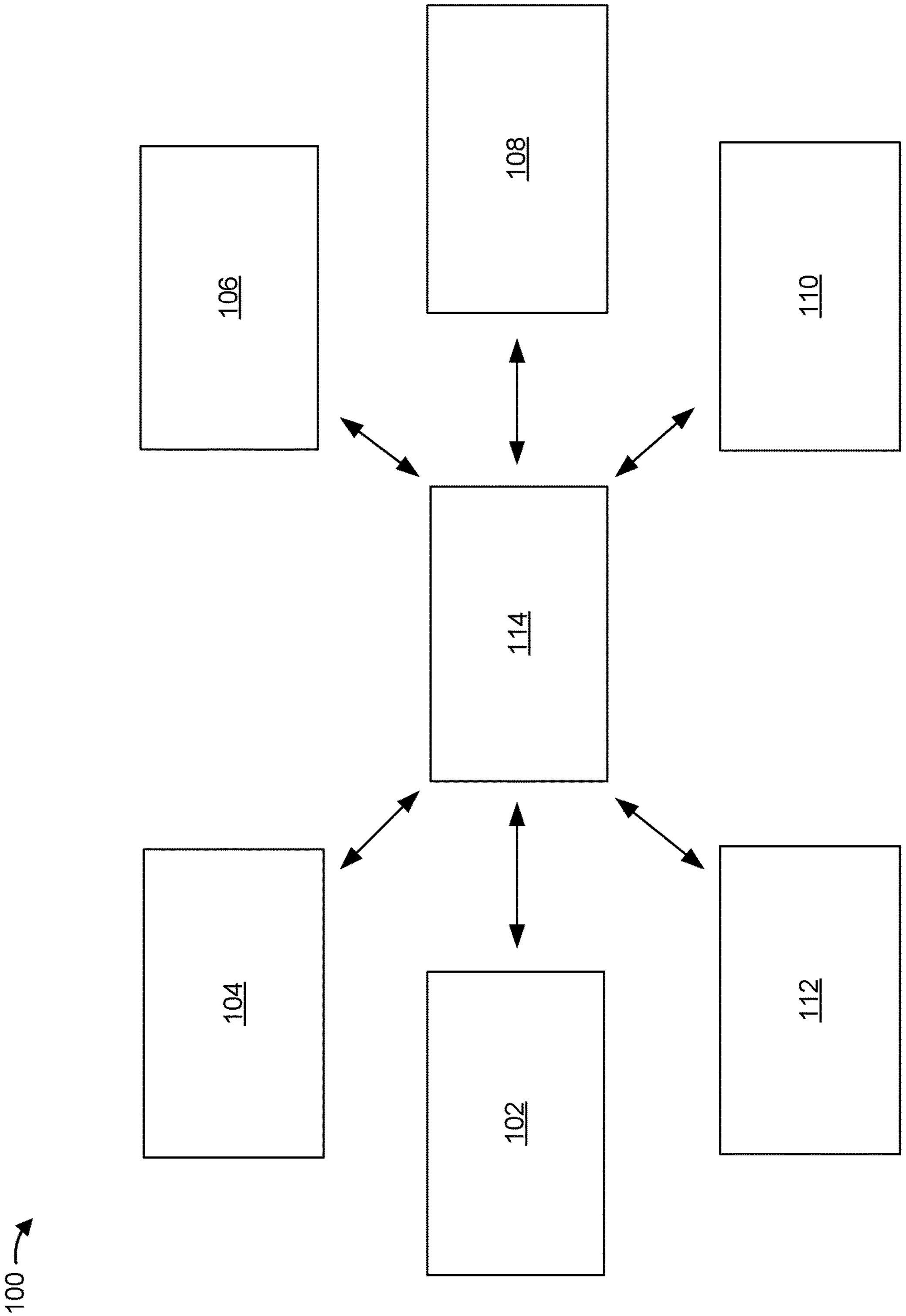
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor resistor structure (e.g., a thin film resistor structure, or TFR structure) may be formed in a back end of line (BEOL) region of a semiconductor device. A resistive layer of the TFR structure may be formed in a dielectric layer of the BEOL region. Contact structures of the TFR structure may be formed over the resistive layer. Furthermore, metal layers of the TFR structure may be formed over the contact structures, where electrical terminals (e.g., routing pins) that route an electrical current through the TFR structure are located at end regions of the metallization layers.

For a high-impedance TFR structure (e.g., greater than approximately 50 ohms impedance) and for a variety of applications, variations in resistivities within the TFR structure typically do not have a substantial effect on a performance of the semiconductor device. However, for a low-impedance TFR structure (e.g., less than approximately 50 ohms impedance) and for a radio frequency (RF) application, variations in the resistivities within the TFR structure can reduce a performance of the semiconductor device. Additionally, or alternatively, if a length-to-width ratio of the low-impedance TFR structure is less than approximately one, a layout of the contact structures, in combination with the electrical terminals located at the end regions of the metallization layers, may cause an uneven distribution of an electrical current within the low-impedance-TFR structure and further reduce the performance of the semiconductor device.

Some implementations described herein include techniques and apparatus for forming a semiconductor device including a semiconductor resistor structure. The semiconductor resistor structure (e.g., a low-impedance TFR structure) may include a resistive layer having an approximately rectangular shape (e.g., a length-to-width ratio that is less than approximately one). The semiconductor resistor structure includes contact structures connected to the resistive layer, a conductive bus structure having an approximately rectangular shape that connects to the contact structures, and an electrical terminal (e.g., a routing pin) centrally located at or near an edge of the conductive bus structure.

The centrally located electrical terminal, in combination with the approximately rectangular shape of the conductive bus structure, may improve a distribution of an electrical current throughout the semiconductor resistor structure relative to another semiconductor resistor structure that does not include the centrally located electrical terminal and/or the conductive bus structure having the approximately rectangular shape. The improved distribution of the electrical current may reduce a variation in resistance within the semiconductor resistor structure.

In this way, a performance of a semiconductor device including the semiconductor resistor structure is improved.

Improving the performance of the semiconductor device may increase a manufacturing yield, of the semiconductor device, to a particular performance threshold, thereby reducing an amount of resources required to support a market that consumes a volume of the semiconductor device satisfying the particular performance threshold (e.g., semiconductor processing tools, labor, raw material, and/or computing resources).

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform a series of semiconductor processing operations that form a semiconductor resistor structure described herein. For example, the series of semiconductor processing operations may include forming a row of contact structures along a length-wise edge of an approximately rectangular-shaped resistive layer and forming a dielectric layer over the row of contact structures. The series of semiconductor processing operations includes forming a recess in the dielectric layer having a first side that is biased near the row of contact structures and a second side that is opposite the first side and biased away from the row of contact structures, where the recess exposes the row of contact structures. The series of semiconductor processing operations includes forming a conductive bus structure in the recess, where forming the conductive bus structure electrically connects the conductive bus structure to the approximately rectangular-shaped resistive layer through the row of contact structures. In some implementations, one or more of the semiconductor processing tools 102-112 and/or the wafer/die transport tool 114 may perform one or more operations described in connection with FIGS. 2, 3, 4, 5A-5J, 6, 7, 8, and/or 9, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
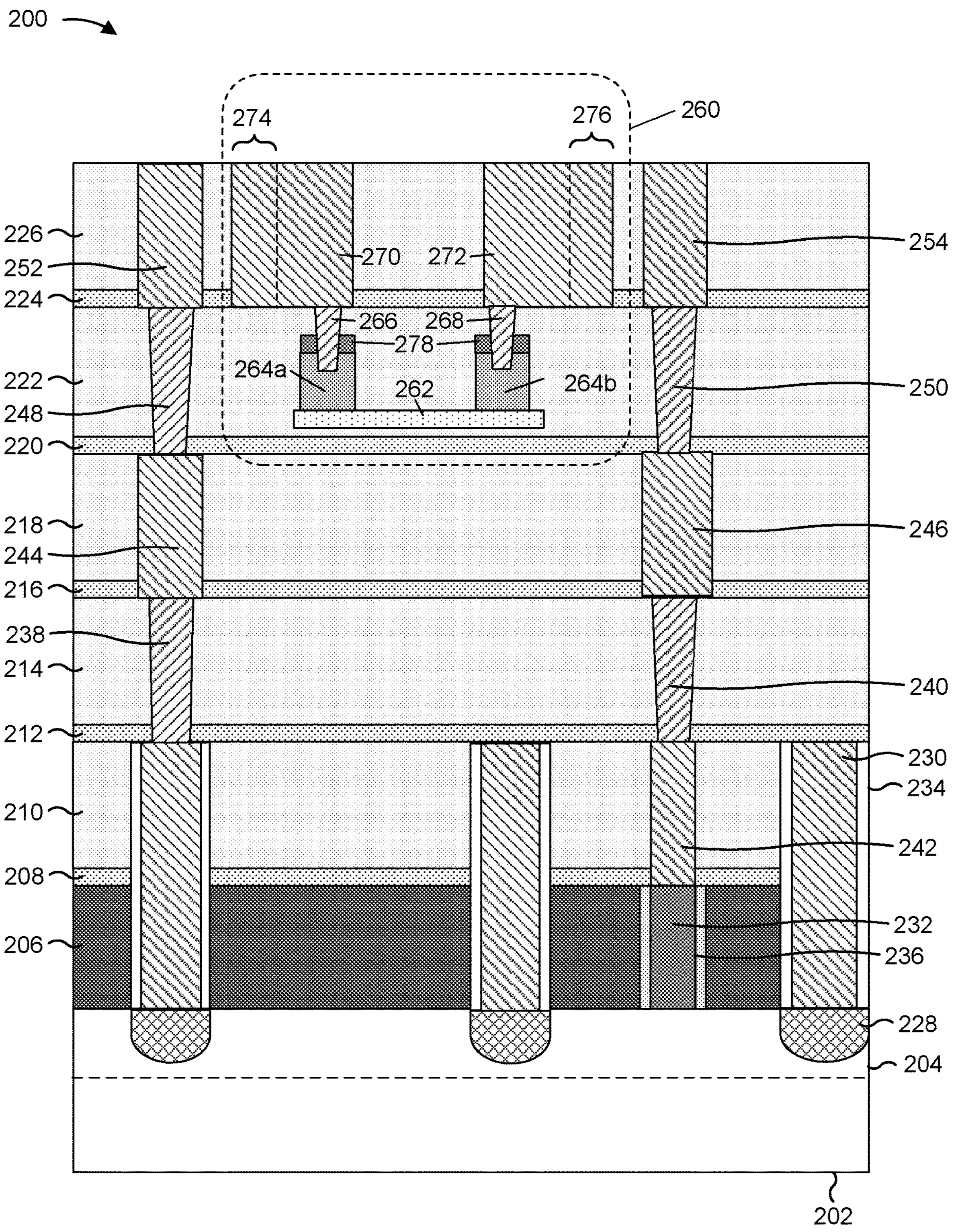
FIG. 2 is a diagram of a portion of an example semiconductor device described herein.

FIG. 2 is a diagram of a portion of an example semiconductor device 200 described herein. The semiconductor device 200 includes an example of a semiconductor device, such as a semiconductor memory device (e.g., a static random access memory (SRAM), a dynamic random access memory (DRAM)), a semiconductor logic device, a processor, an input/output device, or another type of semiconductor device that includes one or more transistors.

The semiconductor device 200 includes a substrate 202 (e.g., a silicon substrate) and one or more fin structures 204. The semiconductor device 200 further includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor device 200 (or the layers included therein) to be selectively etched or protected from etching to form one or more of the structures included in the semiconductor device 200.

As further shown in FIG. 2, the semiconductor device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor device 200.

The epitaxial regions 228 are electrically connected to metal source or drain contacts 230 of the transistors included in the semiconductor device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the metal source or drain contacts 230.

As further shown in FIG. 2, the metal source or drain contacts 230 and the gates 232 are electrically connected to one or more types of interconnects. The interconnects electrically connect the transistors of the semiconductor device 200 and/or electrically connect the transistors to other areas and/or components of the semiconductor device 200. In some implementations, the interconnects electrically connect the transistors to a back end of line (BEOL) region of the semiconductor device 200.

The metal source or drain contacts 230 are electrically connected to source or drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of Conductive layers, each including one or more metallization layers and/or vias. As an example, the interconnects 238 and 240 may be electrically connected to an MO metallization layer that includes conductive structures 244 and 246. The MO metallization layer is electrically connected to a V0 via layer that includes vias 248 and 250. The V0 via layer is electrically connected to an MI metallization that includes conductive structures 252 and 254. In some implementations, the Conductive layers of the semiconductor device 200 includes additional metallization layers and/or vias that connect the semiconductor device 200 to a package. The BEOL region of the semiconductor device 200 may refer to the region of the semiconductor device 200 above the ESL 208, including the structures/layers 210-226 and 238-254.

As further shown in FIG. 2, the semiconductor device 200 may include one or more devices and/or structures in the BEOL region of the semiconductor device 200. For example, the semiconductor device 200 may include one or more semiconductor resistor structures 260 in the BEOL region of the semiconductor device 200. The semiconductor resistor structure 260 may be included in one or more of the dielectric layers 210, 214, 218, 222, and/or 226 in the BEOL region of the semiconductor device 200. Accordingly, the semiconductor resistor structure 260 may be referred to as a resistor structure or a thin-film resistor (TFR) structure, among other examples.

The semiconductor resistor structure 260 includes a resistive layer 262. The resistive layer 262 may include one or more materials configured to provide electrical resistance. In some implementations, the resistive layer 262 includes silicon chromium (SiCr) resistive material. Silicon chromium resistive material may provide a reduced temperature coefficient of resistance (TCR) relative to other types of resistive material (e.g., polysilicon resistive materials). The reduced TCR may result in reduce changes in resistance in the semiconductor resistor structure 260, relative to a semiconductor resistor structure that includes polysilicon resistive materials, due to heat. In some implementations, a thickness of the resistive layer 262 may be included in a range of approximately 50 angstroms to approximately 600 angstroms. However, other values for the range are within the scope of the present disclosure.

The semiconductor resistor structure 260 includes contact structures 264*a* and 264*b* over and/or on the resistive layer 262. The contact structures 264*a* and 264*b* are electrically connected with the resistive layer 262 and provide an input to, and an output from, the resistive layer 262. Thus, the contact structures 264*a* and 264*b* function as the terminals of the semiconductor resistor structure 260. The contact structures 264*a* and 264*b* may each include one or more electrically conductive materials, such as titanium nitride (TiN), a ceramic material, a metal material, a metal alloy, and/or another electrically conductive material, among other examples. The contact structures 264*a* and 264*b* may be spaced apart by the dielectric layer 222 such that the contact structures 264*a* and 264*b* are electrically isolated to reduce the likelihood of electrical shorting between the contact structures 264*a* and 264*b*. In some implementations, a thickness of the contact structures 264*a* and 264*b* is included in a range of approximately 650 angstroms to approximately 850 angstroms. However, other values for the range are within the scope of the present disclosure.

The contact structure 264*a* may be physically coupled and/or electrically coupled with a row of vertical interconnect access structures (vias) 266 and/or another type of interconnect structure. In some implementations, the contact structure 264*a* corresponds to a bus structure. Further, and as shown in FIG. 2, the row of vias 266 may be above a length-wise edge of the resistive layer 262.

The contact structure 264*b* may be physically coupled and/or electrically coupled with a row of vias 268 and/or another type of interconnect structure. In some implementations, the contact structure 264*b* corresponds to a bus structure. Further, and as shown in FIG. 2, the row of vias 268 may be above an opposite length-wise edge of the resistive layer 262.

The row of vias 266 may be physically coupled and/or electrically coupled with a conductive bus structure 270 and/or another type of metallization layer. The row of vias 268 may be physically coupled and/or electrically coupled with a conductive bus structure 272 and/or another type of metallization layer. The rows of vias 266 and 268, and/or the conductive bus structures 270 and 272, may include materials similar to those included in one or more of the structures 238-254. The rows of vias 266 and 268 may be included in the dielectric layer 222 and may respectively extend into a portion of the contact structures 264*a* and 264*b*. The conductive bus structures 270 and 272 may be included in the dielectric layer 226 and may be extend through the ESL 224. In some implementations, the conductive bus structures 270 and 272 are top metal layers in the semiconductor device 200.

In some implementations, and as shown in FIG. 2, the conductive bus structure 270 includes an electrical terminal 274. The electrical terminal 274 may be a protrusion that extends from the conductive bus structure 270 and laterally away from a central region of the semiconductor resistor structure 260.

Further, and in some implementations and as shown in FIG. 2, the conductive bus structure 272 includes an electrical terminal 276. The electrical terminal 276 may be a protrusion the that extends from the conductive bus structure 272 and laterally away from the central region of the semiconductor resistor structure 260 (e.g., a center of the resistive layer 262).

Capping layers 278 may be included over and/or on the contact structures 264*a* and 264*b*. The rows of vias 266 and 268 may extend through the capping layers 278. The capping layers 278 may include a silicon nitride ($Si_xN_y$), a silicon oxynitride (SiON), a high dielectric constant (high-K) dielectric material, and/or another suitable dielectric material that may provide electrical isolation for top surfaces of the contact structures 264*a* and 264*b*. The capping layers 278 may also be used as a hard mask layer for patterning the contact structures 264*a* and 264*b* during fabrication/formation of the semiconductor resistor structure 260. In some implementations, a thickness of the capping layers 278 may be included in a range of approximately 300 angstroms to approximately 400 angstroms. However, other values for the range are within the scope of the present disclosure.

As indicated above, FIG. 2 is provided as an example. Other examples may differ from what is described with regard to FIG. 2.

Figure 3:
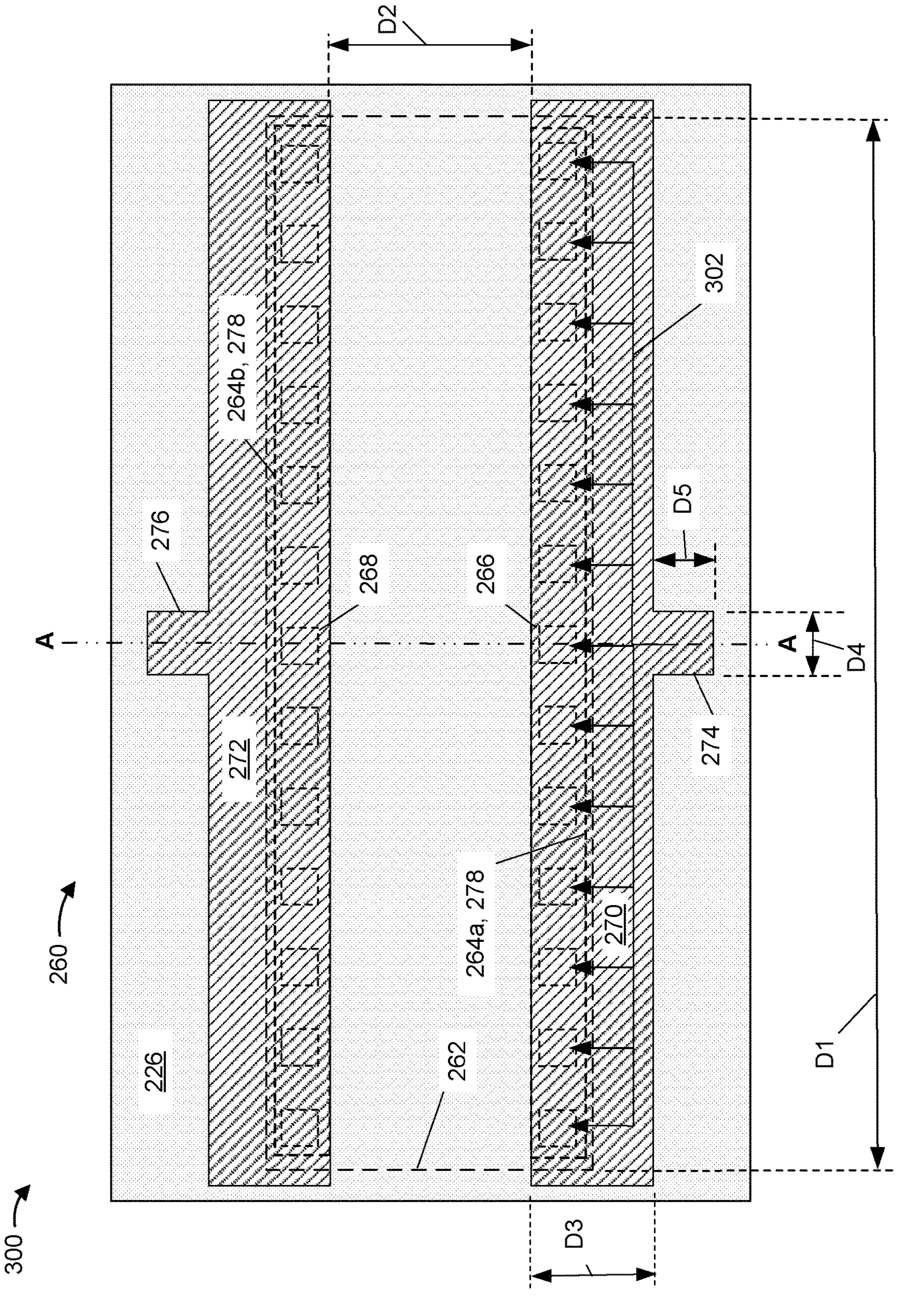
FIG. 3 is a diagram of an example implementation of a semiconductor resistor structure described herein.

FIG. 3 is a diagram of an example implementation 300 of a semiconductor resistor structure (e.g., the semiconductor resistor structure 260) described herein. FIG. 3 illustrates a top-down view of the semiconductor resistor structure 260. FIG. 3 further illustrates a reference cross-section A-A that is used in later figures, including FIGS. 4 and 5A-5J. Cross-section A-A is in a plane across the conductive bus structure 270, the conductive bus structure 272, the electrical terminal 274, and the electrical terminal 276. Some structures/layers are illustrated in dashed lines as an indication that those structures/layers are located under one or more other structures/layers in the semiconductor resistor structure 260.

As shown in FIG. 3, a row of vias 266 is located at or near an edge of the resistive layer 262. As shown in FIG. 3, an edge region of the conductive bus structure 270 may be over (and/or connected to) the row of vias 266. Further, as shown in FIG. 3, the conductive bus structure 270 includes an opposite edge region, at or near which the electrical terminal 274 is located. In some implementations, the location of the electrical terminal 274 further corresponds to an approximate mid-axis of the row of the 266 (e.g., section line A-A in FIG. 3). In some implementations, the row of vias 266 electrically connects the conductive bus structure 270 to the resistive layer 262 through the contact structure 264*a* and/or the capping layers 278.

As shown in FIG. 3, a row of vias 268 is located at or near an opposite edge of the resistive layer 262. As shown in FIG. 3, an edge region of the conductive bus structure 272 may be over (and/or connected to) the row of vias 268. Further, as shown in FIG. 3, the conductive bus structure 272 includes an opposite edge region, at or near which the electrical terminal 276 is located. In some implementations, the location of the electrical terminal 276 further corresponds to an approximate mid-axis of the row of the rows of vias 268 (e.g., section line A-A in FIG. 3). In some implementations, the row of vias 268 electrically connects the conductive bus structure 272 to the resistive layer 262 through the contact structure 264*b* and/or the capping layers 278.

In FIG. 3, the semiconductor resistor structure 260 includes an approximately rectangular shape. Further, and as shown in FIG. 3, the resistive layer 262 includes an approximately rectangular shape.

For the semiconductor resistor structure 260 and/or the resistive layer 262 including the approximately rectangular shapes, the centralized locations of the electrical terminals 274 and 276, in combination with the rectangular shapes of the conductive bus structures 270 and 272, may improve a uniformity of a distribution of an electrical current 302 throughout the semiconductor resistor structure 260.

The improved distribution of the electrical current 302 may improve a performance of integrated circuitry including the semiconductor resistor structure 260. As an example, a digital-to-analog converter (DAC) circuit including another semiconductor resistor structure formed using another technique (e.g., electrical terminals at ends of conductive bus structures) may experience a variation in resistance of up to approximately 10%, whereas a DAC circuit including the semiconductor resistor structure 260 may experience a variation in resistance of less than approximately 5%. As another example, a radio frequency (RF) circuit including the semiconductor resistor structure 260 may experience parasitic capacitance that is up to 85% lesser relative to another RF circuit including another semiconductor resistor structure.

In this way, a performance of a semiconductor device including the semiconductor resistor structure 260 is improved. Improving the performance of the semiconductor device may increase a manufacturing yield of the semiconductor device to a particular performance threshold, thereby reducing an amount of resources required to support a market that consumes a volume of the semiconductor device satisfying the particular performance threshold (e.g., semiconductor processing tools, labor, raw material, and/or computing resources).

To achieve performance thresholds for integrated circuitry high frequency applications (e.g., integrated circuitry for RF devices that require less than approximately 50 ohms impedance), several dimensional characteristics may apply to one or more structures of the semiconductor resistor structure 260. For example, a length D1 of the resistive layer 262 may be included in a range of approximately 0.6 microns to approximately 0.8 microns. If the length D1 is less than approximately 0.6 microns, or greater than approximately 0.8 microns, an impedance of the semiconductor resistor structure 260 may be greater than approximately 50 ohms. However, other values and ranges for the length D1 are within the scope of the present disclosure.

Additionally, a distance D2 between contact structures connecting the conductive bus structures 270 and 272 with the resistive layer 262 (e.g., the contact structures 264*a* and 264*b*) may be included in a range of approximately 0.15 microns to approximately 0.45 microns. If the distance D2 is less than approximately 0.15 microns, or greater than approximately 0.45 microns, an impedance of the semiconductor resistor structure 260 may be greater than approximately 50 ohms. However, other values and ranges for the distance D2 are within the scope of the present disclosure.

As shown in FIG. 3, the conductive bus structure 270 (and/or the conductive bus structure 272) may have a width D3 that is included in a range of approximately 0.3 microns to approximately 1.5 microns. If the width D3 is less than approximately 0.3 microns, "crowding" of the electrical current 302 may occur and the conductive bus structure 270 may not uniformly distribute the electrical current 302 throughout the semiconductor resistor structure 260 (e.g., uniformly distribute the electrical current 302 among the row of vias 266). If the width D3 is greater than approximately 1.5 microns, a size of a semiconductor device including the semiconductor resistor structure 260 may increase to increase a cost of the semiconductor device. Furthermore, and if the width D3 is greater than approximately 1.5 microns, overlapping metal layers within the semiconductor device may cause an increase in a parasitic capacitance of the semiconductor resistor structure 260 to reduce a performance of integrated circuitry within the semiconductor device. However, other values and ranges for the width D3 are within the scope of the present disclosure.

For the semiconductor resistor structure (e.g., the semiconductor resistor structure 260 including the dimensional characteristics D1 and D2), the electrical terminal 274 (and/or the electrical terminal 276) may have a width D4 that is greater than approximately 0.3 microns and a length D5 that is greater than approximately 0.14 microns. If the width of D4 of the electrical terminal 274 is less than approximately 0.3 microns, "crowding" of the electrical current 302 may occur near a central region of the conductive bus structure 270 and the electrical current 302 may not be uniformly distributed throughout the semiconductor resistor structure 260 (e.g., uniformly distribute the electrical current 302 among the row of vias 266). Additionally, or alternatively, if the length D5 of the electrical terminal 274 is less than approximately 0.14 microns, a design rule impacting fabrication of the semiconductor device (e.g., tolerance stacks within the semiconductor resistor structure 260) may be violated. However, other values and ranges for the width D4 and the length D5 are within the scope of the present disclosure.

As indicated above, FIG. 3 is provided as an example. Other examples may differ from what is described with regard to FIG. 3.

Figure 4:
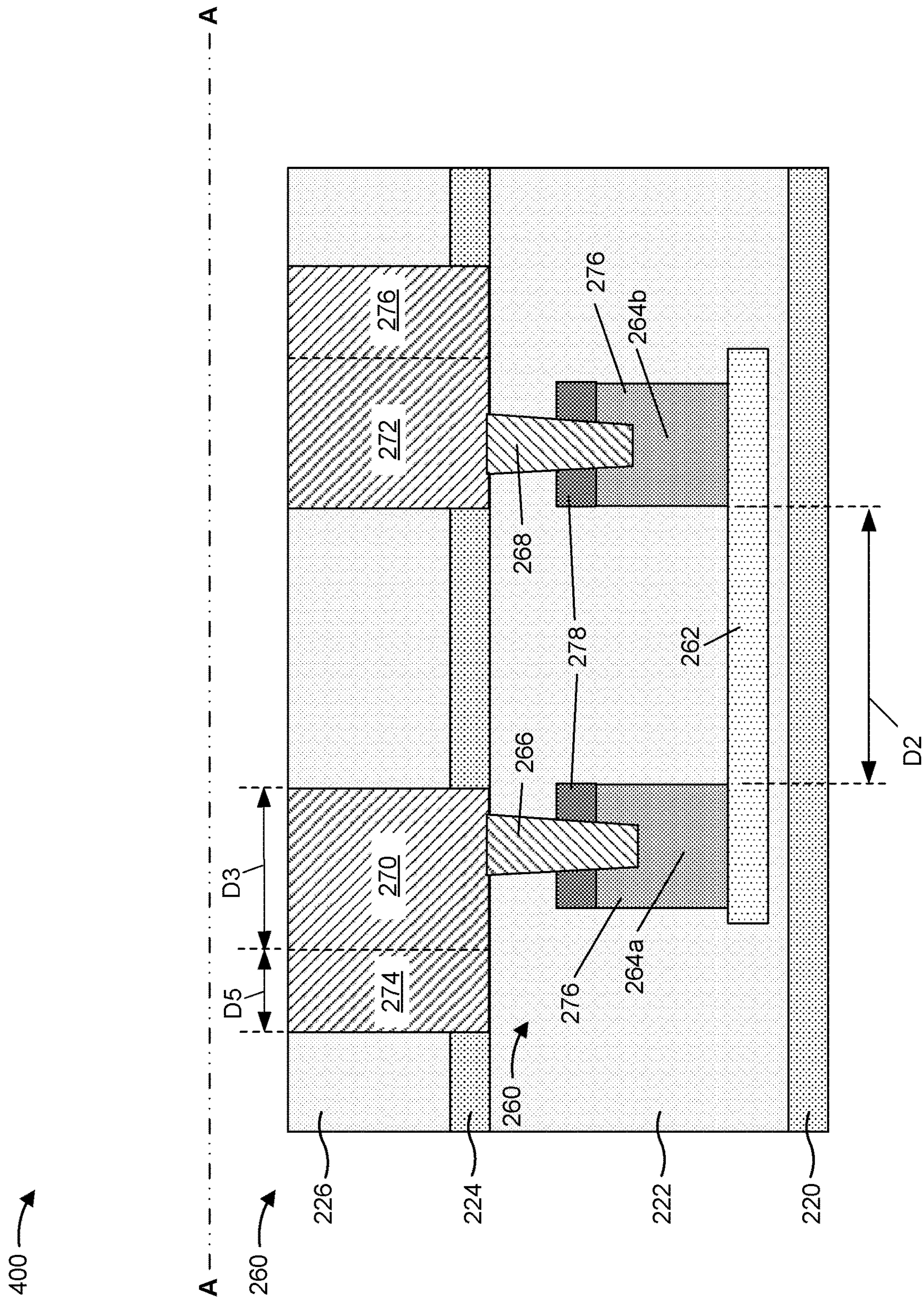
FIG. 4 is a diagram of an example implementation of a semiconductor resistor structure described herein.

FIG. 4 is a diagram of an example implementation 400 of a semiconductor resistor structure (e.g., the semiconductor resistor structure 260) described herein. FIG. 4 illustrates a cross-section view of the semiconductor resistor structure 260 in the cross-section A-A illustrated in FIG. 3.

The semiconductor resistor structure 260 may be included in a portion of the semiconductor device 200, such as in the BEOL region of the semiconductor device 200. In some implementations, the semiconductor resistor structure 260 may be included in the dielectric layer 222, which is included over and/or on the ESL 220. The ESL 224 is included over and/or on the dielectric layer 222, and the dielectric layer 226 is included over and/or on the ESL 224.

The semiconductor resistor structure 260 may include the resistive layer 262, the contact structures 264*a* and 264*b*. The contact structure 264*a* is physically coupled and/or electrically coupled with the via 266, and the via 266 is physically coupled and/or electrically coupled with the conductive bus structure 270. The contact structure 264*b* is physically coupled and/or electrically coupled with the via 268, and the via 268 is physically coupled and/or electrically coupled with the conductive bus structure 272. Capping layers 278 may be included over and/or on the contact structures 264*a* and 264*b*.

FIG. 4 shows additional perspectives of dimensions described in connection with FIG. 3, including the distance D2 between the contact structures 264*a* and 264*b*, the width D3 of the conductive bus structure 270, and the length D5 of the electrical terminal 274.

As indicated above, FIG. 4 is provided as an example. Other examples may differ from what is described with regard to FIG. 4.

As described in connection with FIGS. 2-4, and elsewhere herein, a semiconductor resistor structure (e.g., the semiconductor resistor structure 260) includes a resistive layer (e.g., the resistive layer 262). The semiconductor resistor structure includes a row of contact structures (e.g., the row of vias 266) located at or near an edge of the resistive layer. The semiconductor resistor structure includes a conductive bus structure (e.g., the conductive bus structure 272) that includes a first edge region connected to the row of contact structures, a second edge region that is opposite the first edge region, and an electrical terminal (e.g., the electrical terminal 274), where, in a top-down view of the semiconductor resistor structure, a location of the electrical terminal is at or near an approximate mid-axis of the row of contact structures and at or near the second edge region.

Additionally, or alternatively, a semiconductor resistor structure (e.g., the semiconductor resistor structure 260) includes a resistive layer (e.g., the resistive layer 262). The semiconductor resistor structure includes a first conductive bus structure (e.g., the conductive bus structure 270) above and along a first edge of the resistive layer, where, in a top-down view of the semiconductor resistor structure, the first conductive bus structure has a first length (e.g., the length D1). The semiconductor resistor structure includes a first row of contact structures (e.g., the row of vias 266) between the first conductive bus structure and along the first edge of the resistive layer, where the first row of contact structures electrically connects the first conductive bus structure to the first edge of the resistive layer. The semiconductor resistor structure includes a second conductive bus structure (e.g., the conductive bus structure 272) above and along a second edge of the resistive layer, where the second edge is opposite the first edge, and where, in the top-down view of the semiconductor resistor structure, the second conductive bus structure has a second length (e.g., the length D1). The semiconductor resistor structure includes a second row of contact structures (e.g., the row of vias 268) between the second conductive bus structure and along the second edge of the resistive layer, where the second row of contact structures electrically connects the second conductive bus structure to the second edge of the resistive layer. In some implementations, and in a top-down view of the semiconductor resistor structure, a distance between the second row of contact structures and the first row of contact structures is lesser relative to the first width of the first conductive bus structure or the second width of the second conductive bus structure.

FIGS. 5A-5J are diagrams of an example implementation 500 of forming a semiconductor resistor structure (e.g., the semiconductor resistor structure 260) described herein. In some implementations, one or more of the operations described in connection with the example implementation 500 may be performed by one or more of the semiconductor processing tools 102-112. In some implementations, one or more of the operations described in connection with the example implementation 500 may be performed another semiconductor processing tool. In some implementations, one or more of the operations described in connection with the example implementation 500 may be performed after formation of one or more other structures or layers of the semiconductor device 200.

Figure 5A:
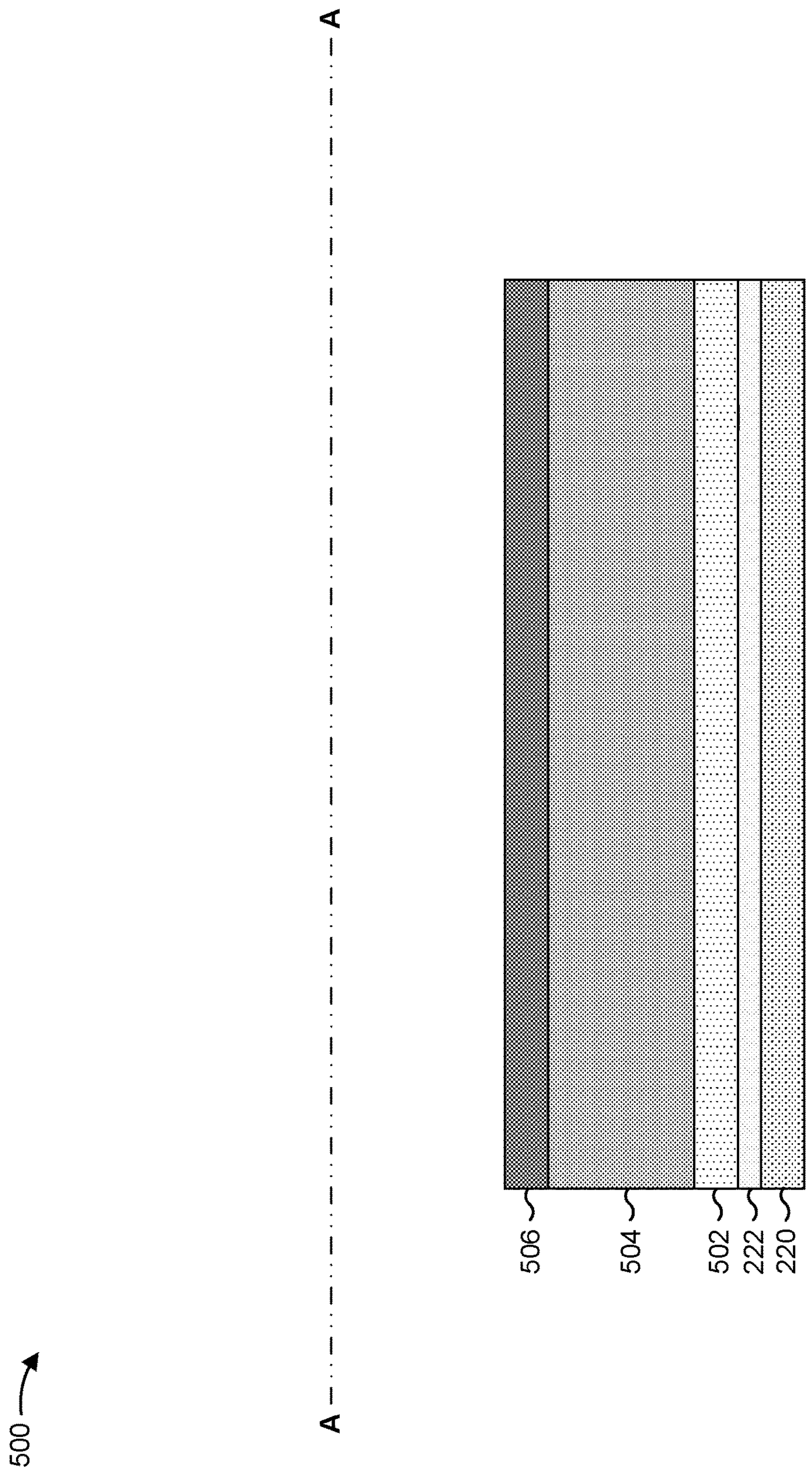
FIGS. 5A-5J are diagrams of an example implementation of forming a semiconductor resistor structure described herein.

Turning to FIG. 5A, the operations described in connection with the example implementation 500 may be performed in a BEOL region of the semiconductor device 200. For example, a portion of the dielectric layer 222 may be formed over and/or on the ESL 220, a dielectric layer 502 may be formed over and/or on the portion of the dielectric layer 222, a conductive layer 504 may be formed over and/or on the dielectric layer 502, and/or a hard mask layer 506 may be formed over and/or on the conductive layer 504, among other examples.

The deposition tool 102 may deposit the ESL 220, the portion of the dielectric layer 222, the dielectric layer 502, and/or the hard mask layer 506 using an epitaxy technique, a CVD technique, a PVD technique, an ALD technique, another deposition technique described above in connection with FIG. 1, and/or a deposition technique other than as described above in connection with FIG. 1. The deposition tool 102 and/or the plating tool 112 may deposit the conductive layer 504 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the ESL 220, the portion of the dielectric layer 206, the dielectric layer 502, the conductive layer 504, and/or the hard mask layer 506.

Figure 5B:
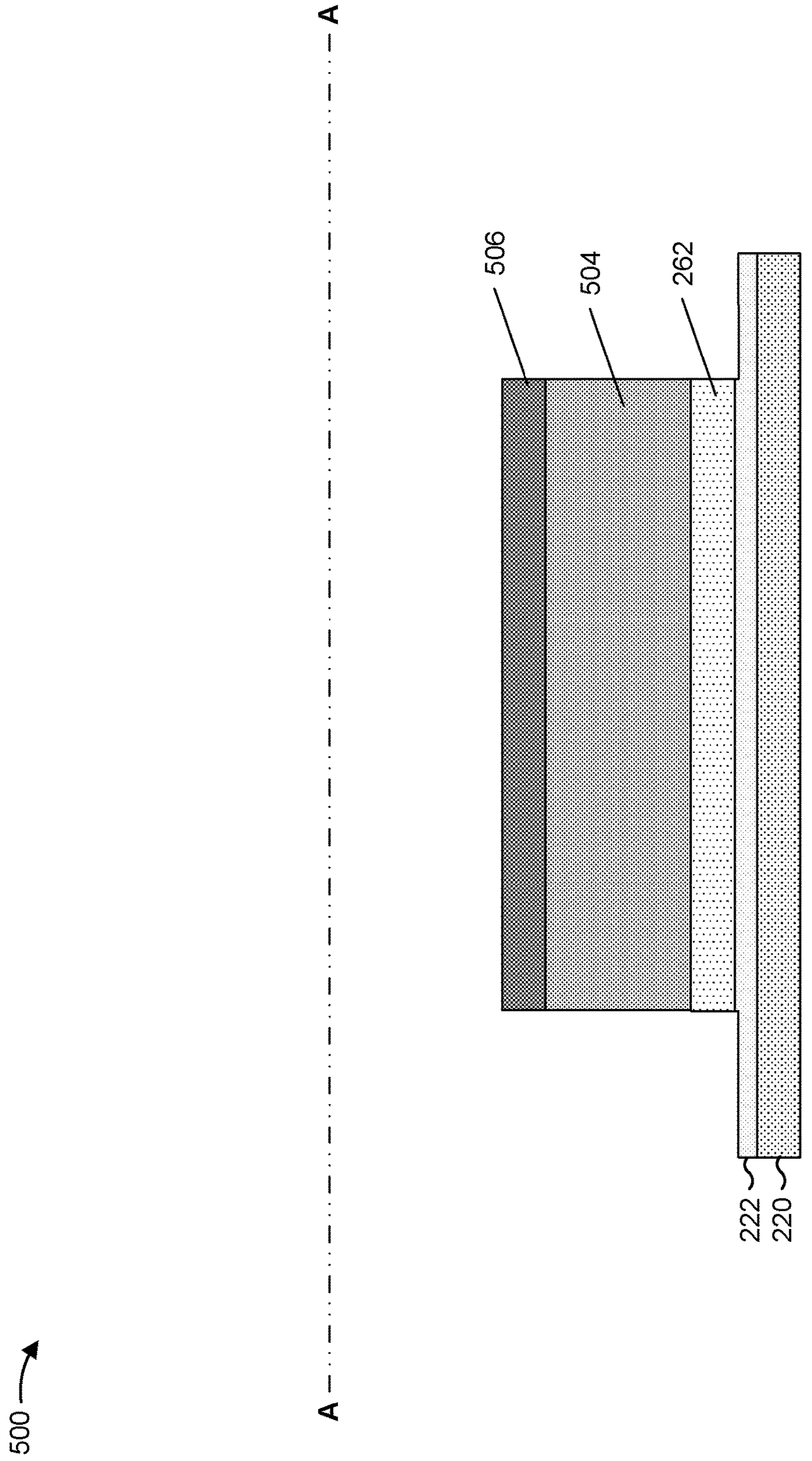

As shown in FIG. 5B, portions of the dielectric layer 502 may be removed to form the resistive layer 262. In some implementations, a pattern in a photoresist layer is used to remove portions of the dielectric layer 502 to form the resistive layer 262. In these implementations, the deposition tool 102 forms the photoresist layer over the hard mask layer 506. The exposure tool 104 exposes the photoresist layer to a radiation source to pattern the photoresist layer. The developer tool 106 develops and removes portions of the photoresist layer to expose the pattern. The etch tool 108 etches through the hard mask layer 506, through the conductive layer 504, and through the dielectric layer 502 to form the resistive layer 262. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, the etch tool 108 etches into a portion of the underlying dielectric layer 222 to ensure that the dielectric layer 502 is fully etched through. This is referred over etching. The combination of the thickness of the resistive layer 262 and the depth of the over etching into the dielectric layer 222 may be included in a range of approximately 400 angstroms to approximately 600 angstroms. However, other values for the range are within the scope of the present disclosure.

Figure 5C:
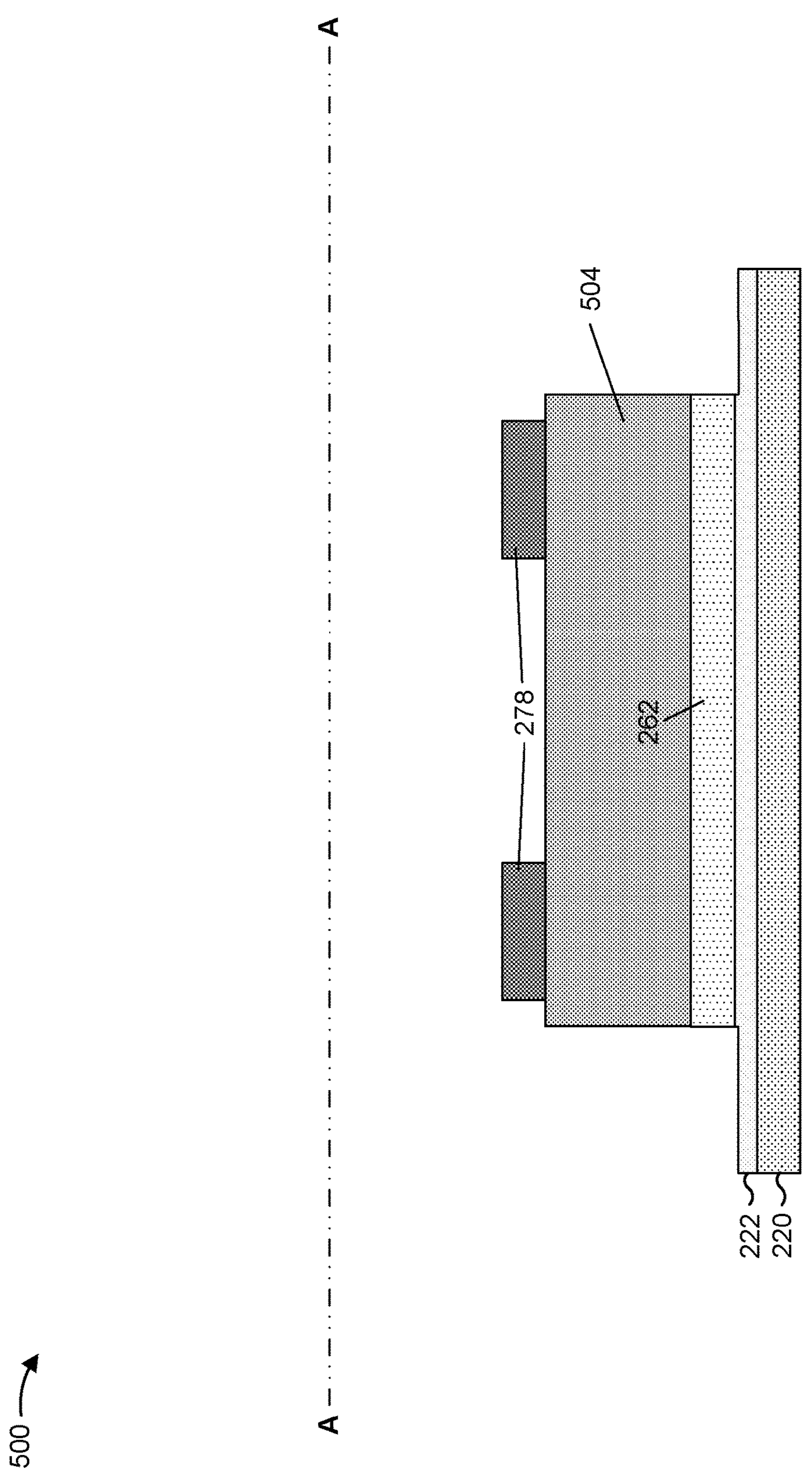

As shown in FIG. 5C, portions of the hard mask layer 506 may be removed. Remaining portions of the hard mask layer 506 correspond to the capping layers 278 of the semiconductor resistor structure 260. In some implementations, a pattern in a photoresist layer is used to remove portions of the hard mask layer 506 to form the capping layers 278. In these implementations, the deposition tool 102 forms the photoresist layer over the hard mask layer 506. The exposure tool 104 exposes the photoresist layer to a radiation source to pattern the photoresist layer. The developer tool 106 develops and removes portions of the photoresist layer to expose the pattern. The etch tool 108 etches through the hard mask layer 506 to form the capping layers 278. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5D:
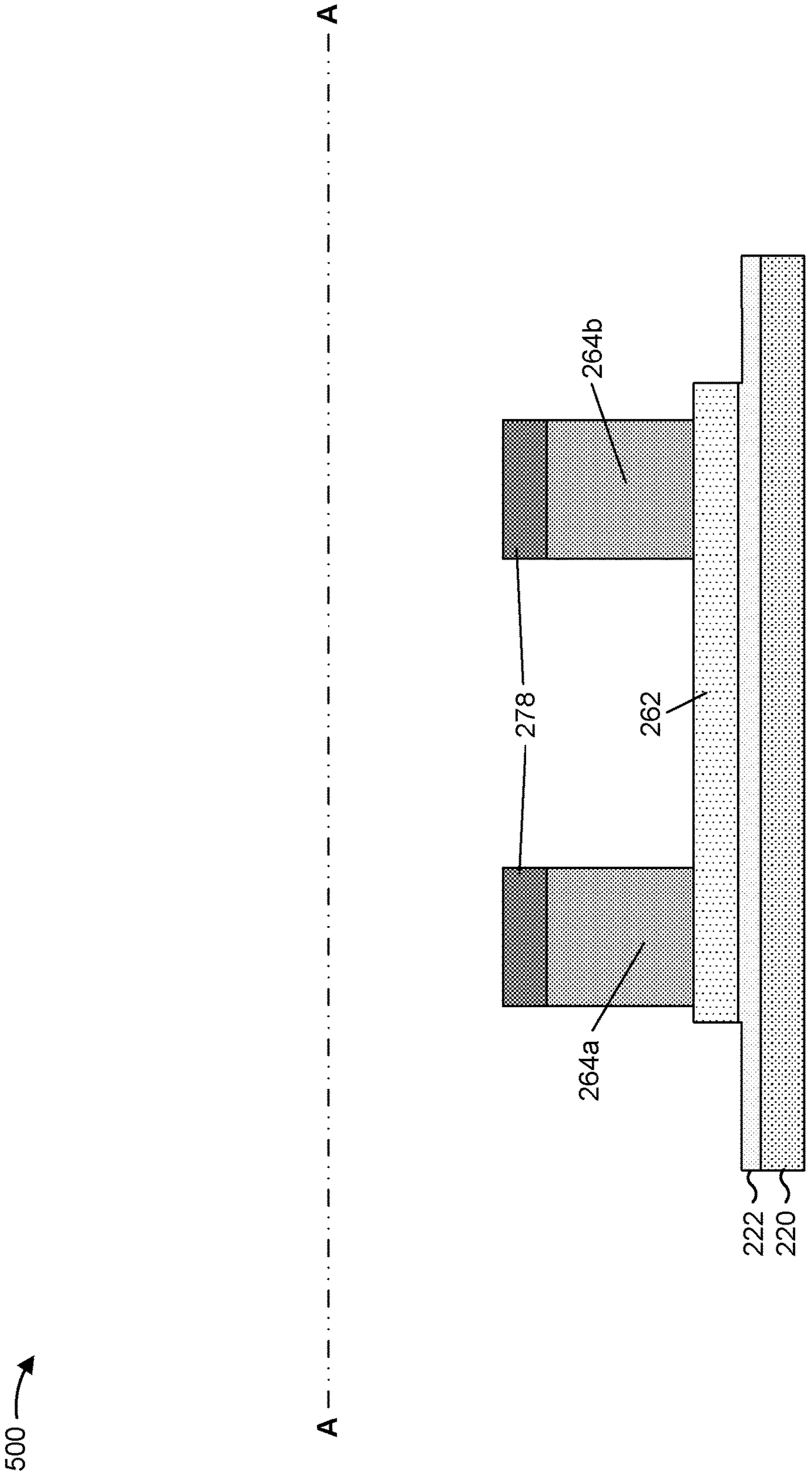

As shown in FIG. 5D, portions of the conductive layer 504 are removed. Remaining portions of the conductive layer correspond to the contact structures 264*a* and 264*b*. The etch tool 108 may etch the conductive layer 504 to remove the portions of the conductive layer 504. The etch tool 108 may etch the conductive layer 504 based on a pattern in the hard mask layer 506 that was formed in the operation to remove the portions of the hard mask layer 506 to form the capping layers 278. In other words, the capping layers 278 function as an etch pattern to etch the conductive layer 504 to form the contact structures 264*a* and 264*b*. In some implementations, the etch operation includes a plasma etch technique, a wet chemical etch technique, and/or another type of etch technique.

Figure 5E:
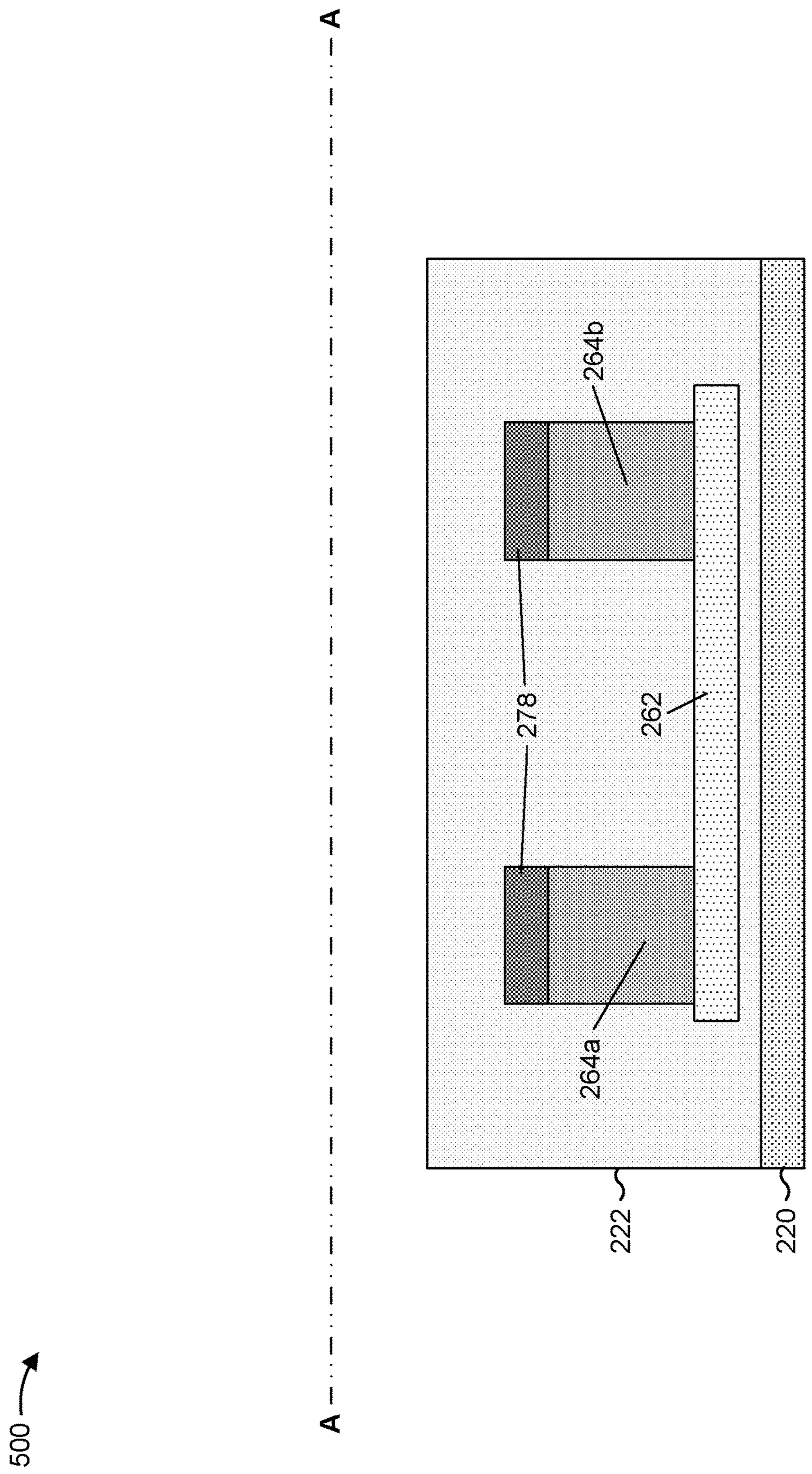

As shown in FIG. 5E, an additional portion of the dielectric layer 222 may be formed over, on, and/or around the semiconductor resistor structure 260. The deposition tool 102 may deposit the additional portion of the dielectric layer 222 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 222 after the additional portion of the dielectric layer 222 is deposited.

Figure 5F:
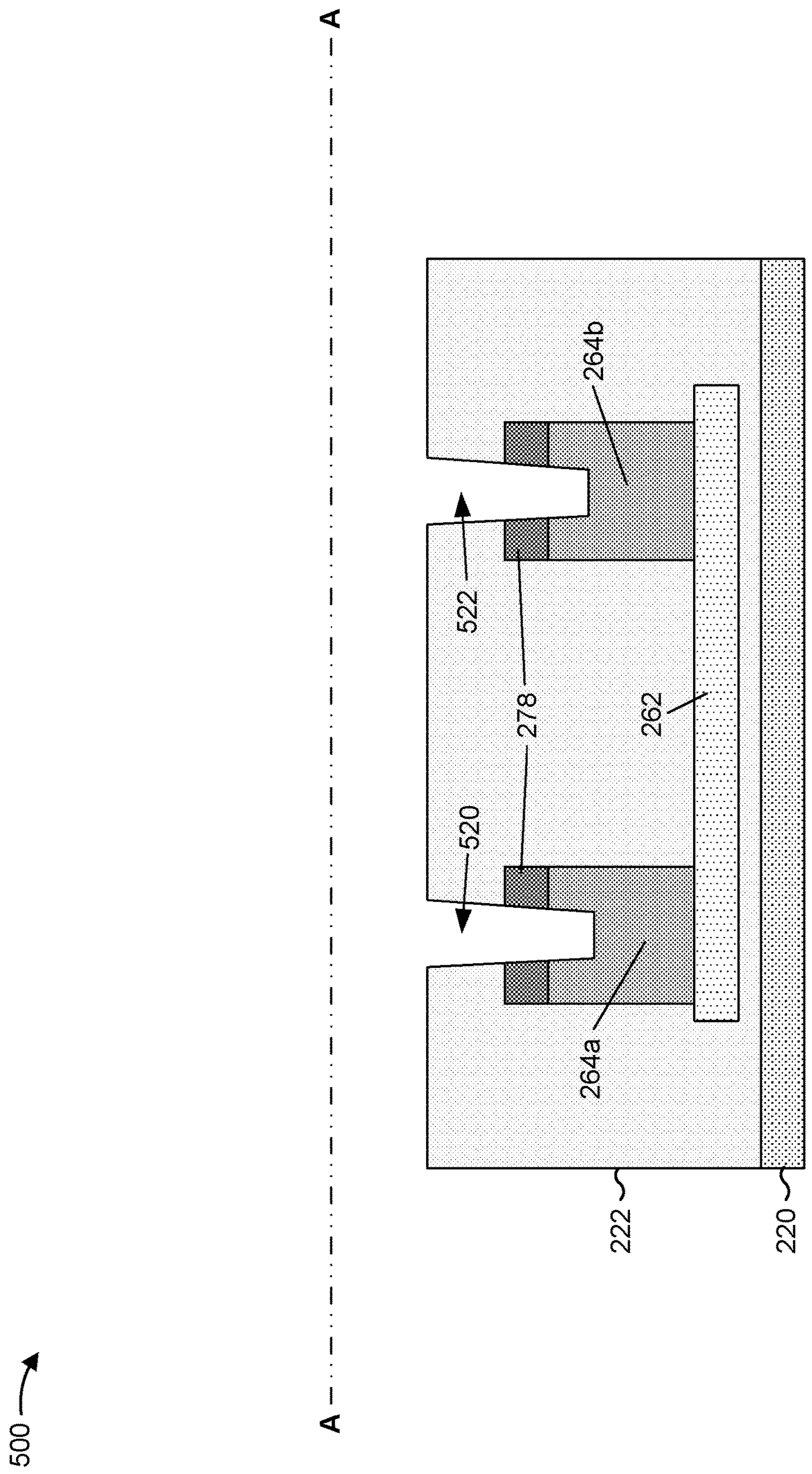

As shown in FIG. 5F, recesses 520 and 522 may be respectively formed in the dielectric layer 222, through the capping layers 278, and into a portion of the contact structures 264*a* and 264*b*. In these implementations, the deposition tool 102 forms the photoresist layer over the dielectric layer 222. The exposure tool 104 exposes the photoresist layer to a radiation source to pattern the photoresist layer. The developer tool 106 develops and removes portions of the photoresist layer to expose the pattern. The etch tool 108 etches through the dielectric layer 222, through the capping layers 278, and into a portion of the contact structures 264*a* and 264*b* to respectively form the recesses 520 and 522. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5G:
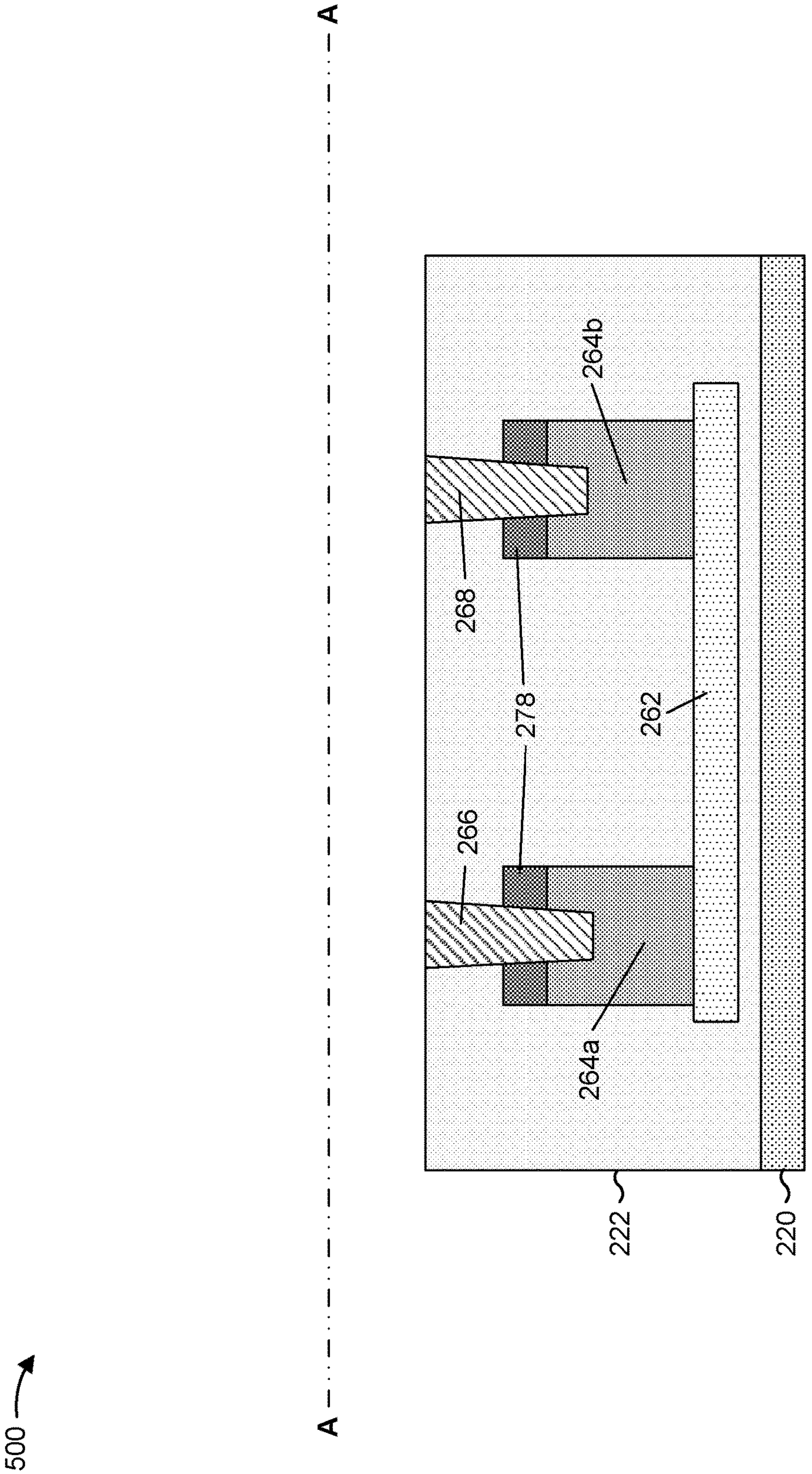

As shown in FIG. 5G, the recesses 520 and 522 may be filled with one or more conductive materials to respectively form the rows of vias 266 and 268 in the recesses 520 and 522. The deposition tool 102 and/or the plating tool 112 may deposit the rows of vias 266 and 268 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the rows of vias 266 and/or the rows of vias 268.

Figure 5H:
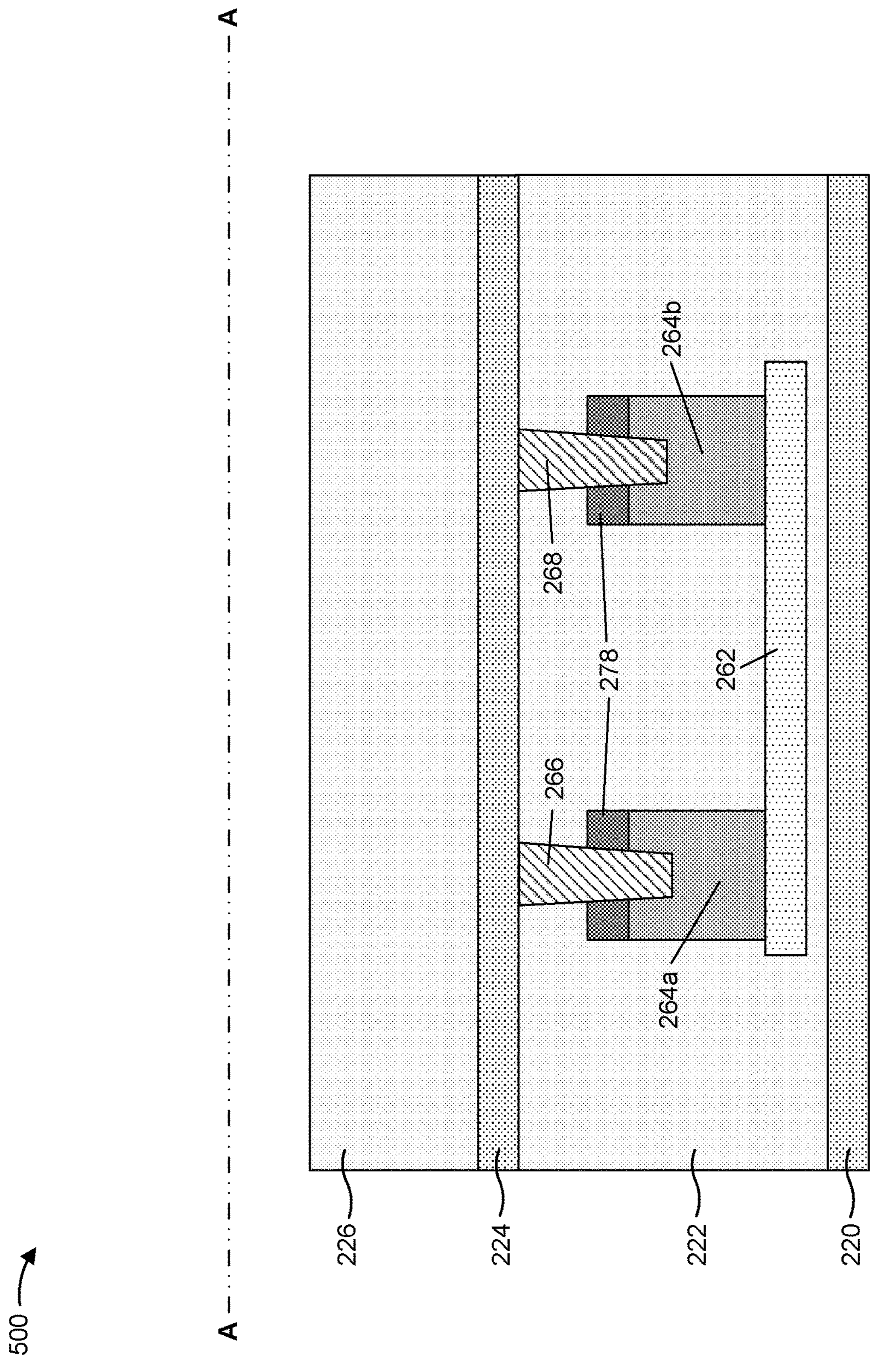

As shown in FIG. 5H, additional dielectric layers of the BEOL region may be formed over the semiconductor resistor structure 260. For example, the ESL 224 may be formed over the semiconductor resistor structure 260 and over and/or on the dielectric layer 222. As another example, the dielectric layer 226 may be formed over and/or on the ESL 224. The deposition tool 102 may deposit the ESL 224 and/or the dielectric layer 226 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the ESL 224 and/or the dielectric layer 226 after the ESL 224 and/or the dielectric layer 226 is deposited.

Figure 5I:
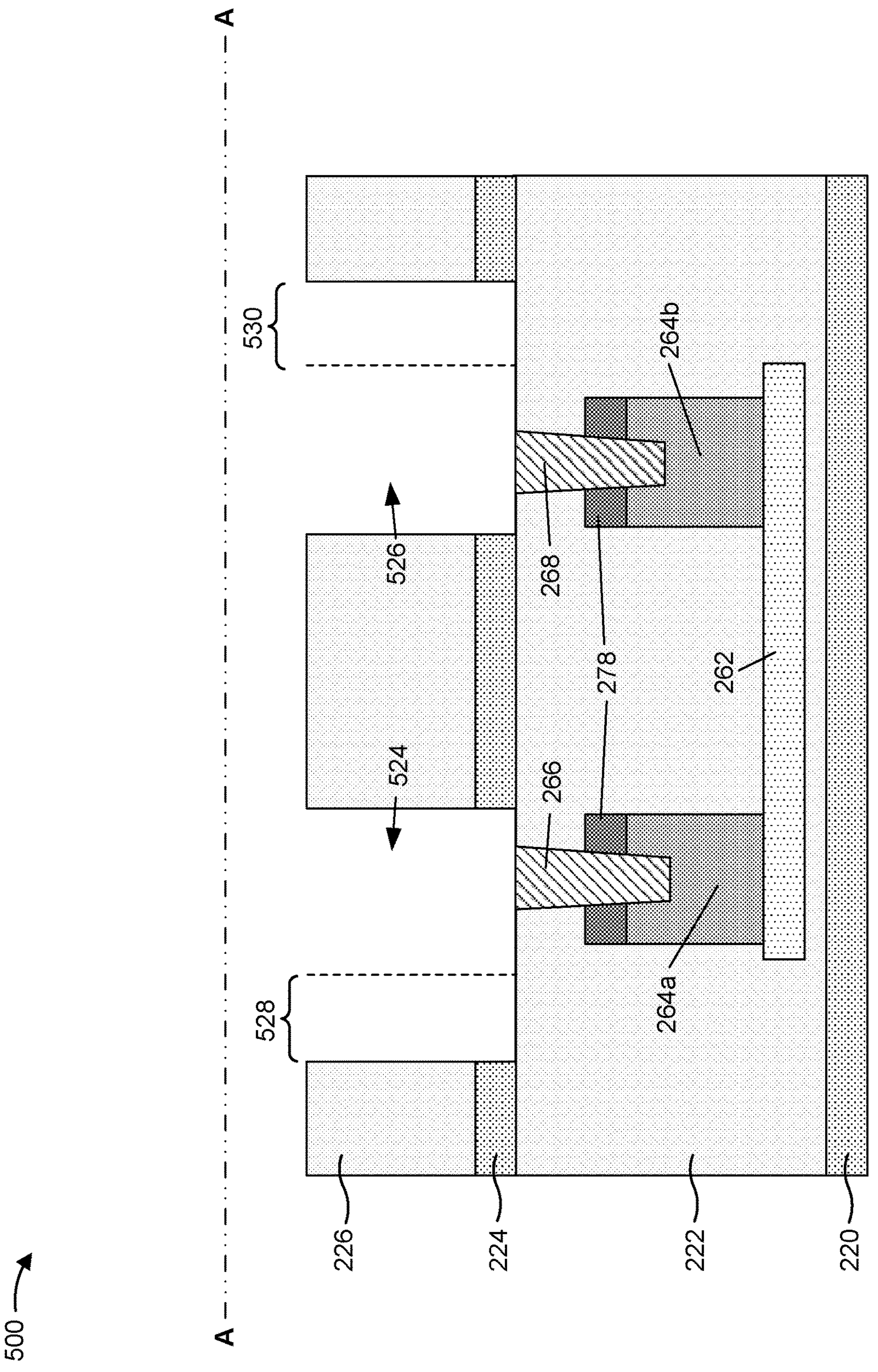

As shown in FIG. 5I, recesses 524 and 526 may be respectively formed through the dielectric layer 226 and through the ESL 224 to expose top surfaces of the rows of vias 266 and 268, respectively. In some implementations, an edge of the recess 524 (e.g., an inner edge) is biased towards the row of vias 266. In some implementations, an edge of the recess 526 (e.g., an inner edge) is biased towards the row of vias 268. The recesses 524 and 526 may further include, respectively, cavities 528 and 530.

In these implementations, the deposition tool 102 forms the photoresist layer over the dielectric layer 226. The exposure tool 104 exposes the photoresist layer to a radiation source to pattern the photoresist layer. The developer tool 106 develops and removes portions of the photoresist layer to expose the pattern. The etch tool 108 etches through the dielectric layer 226 and through the ESL 224 to form the recesses 520 and 522 and/or the cavities 528 and 530. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5J:
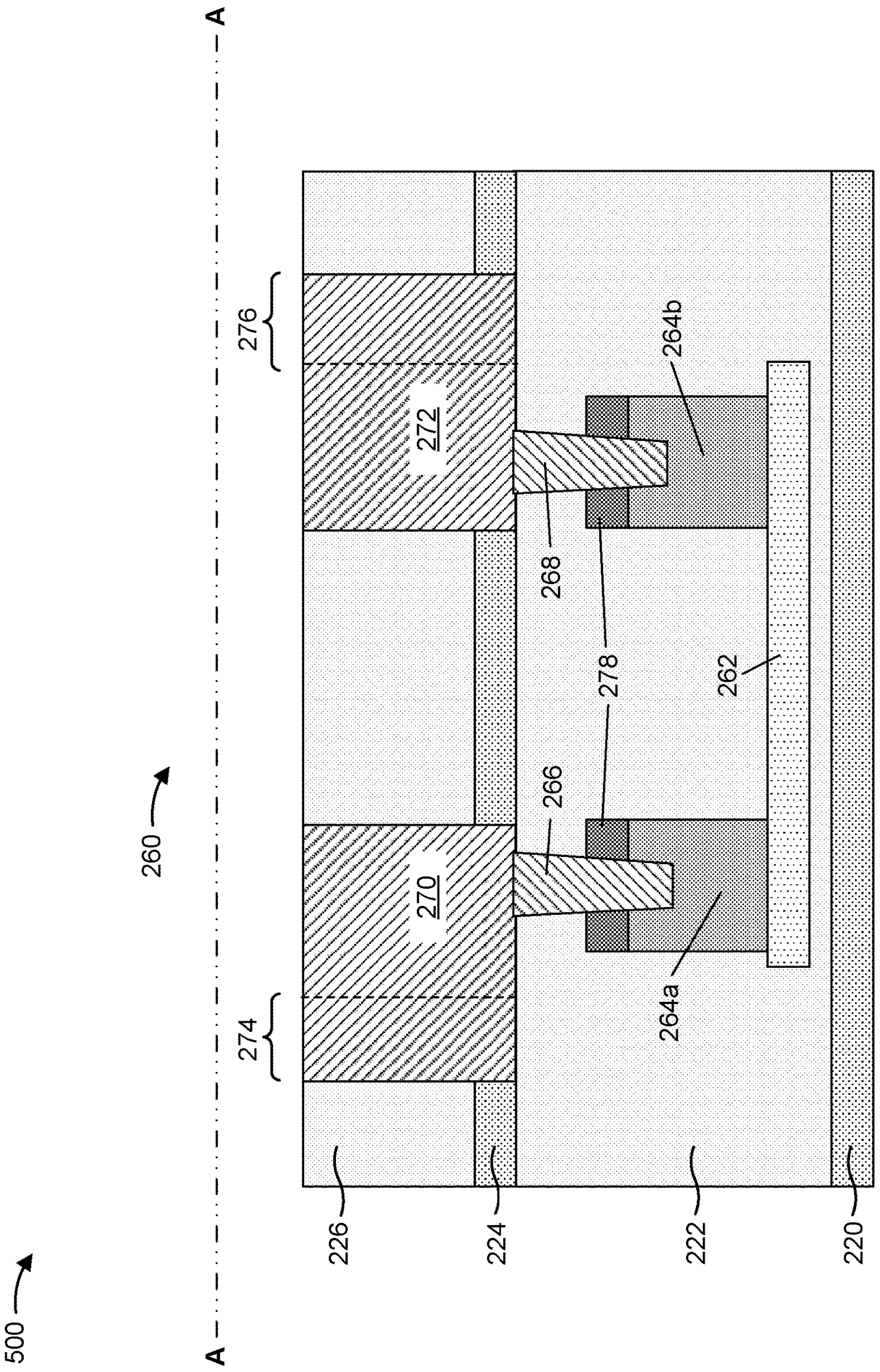

As shown in FIG. 5J, the recesses 524 and 526 may be filled with one or more conductive materials to respectively form the conductive bus structures 270 and 272 in the recesses 524 and 526. Additionally, and as shown in FIG. 5J, the cavities 528 and 530 may be concurrently filled with one or more of the conductive materials to respectively form the electrical terminals 274 and 276. The deposition tool 102 and/or the plating tool 112 may deposit the conductive bus structures 270 and 272, and the electrical terminals 274 and 276, using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the conductive bus structures 270 and 272 and/or the electrical terminals 274 and 276.

As indicated above, FIGS. 5A-5J are provided as an example. Other examples may differ from what is described with regard to FIGS. 5A-5J.

Figure 6:
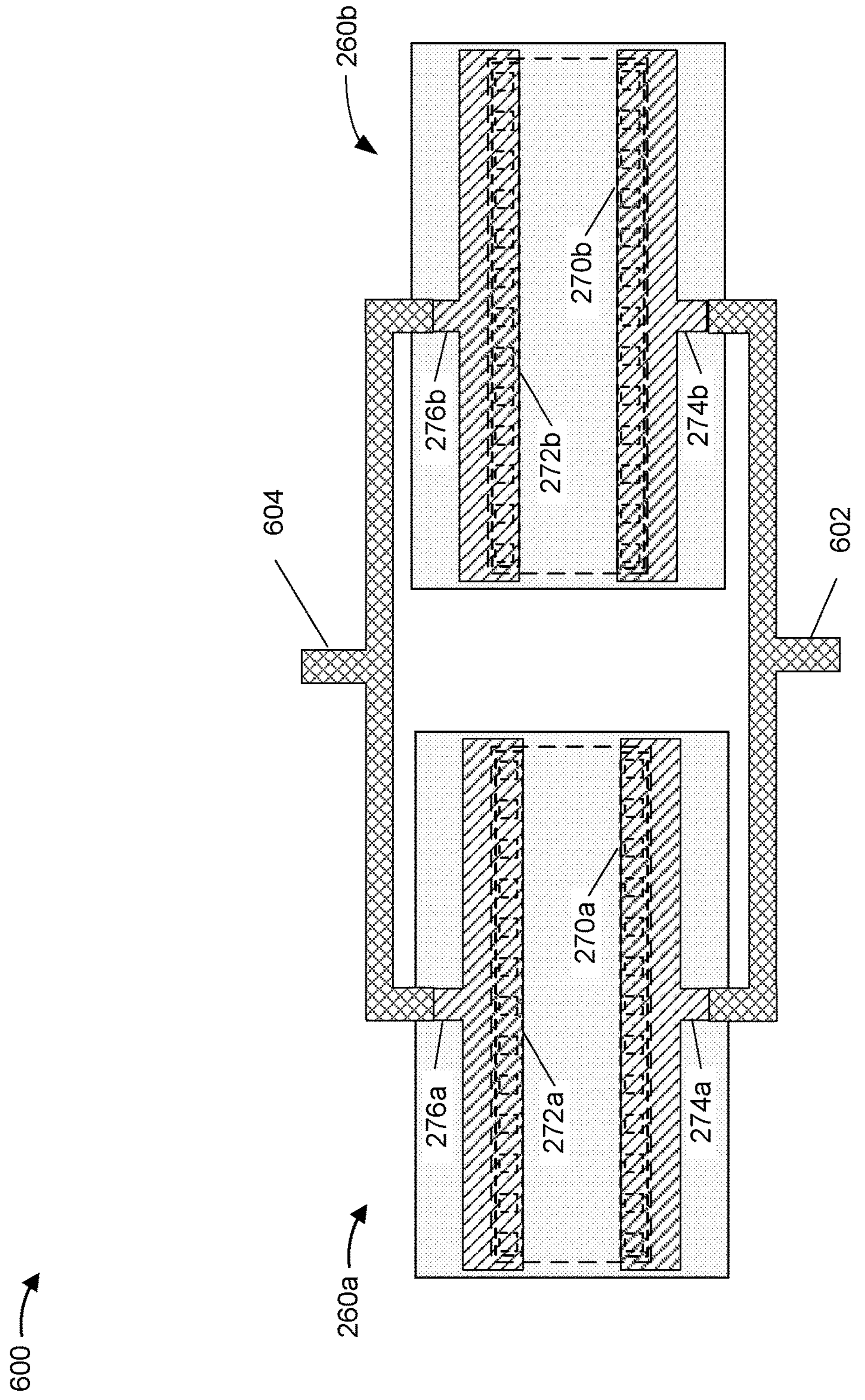
FIG. 6 is a diagram of an example implementation of a semiconductor resistor structure described herein.

FIG. 6 is a diagram of an example implementation 600 of a semiconductor resistor structure described herein. In the top-down view of FIG. 6, the semiconductor resistor structure 260*a* (e.g., a first TFR) is in electrical parallel with the semiconductor resistor structure 260*b* (e.g., a second TFR). The combination of the semiconductor resistor structures 260*a* and 260*b* in electrical parallel may form an ultra-low impedance semiconductor resistor structure.

Using techniques described in connection with FIGS. 5A-5J and elsewhere herein, a conductive bus structure 270*a* of the first semiconductor resistor structure 260*a* may be concurrently formed with a second conductive bus structure 270*b* of the second semiconductor resistor structure 260*b*. In other words, the conductive bus structures 270*a* and 270*b* (and/or the conductive bus structures 272*a* and 272*b*) may be formed on a same metal layer of the semiconductor device 200 using same lithography, etching, and deposition operations. Alternatively, the conductive bus structures 270*a* and 270*b* (and/or the conductive bus structures 272*a* and 272*b*) may be formed on different metal layers of the semiconductive device using separate lithography, etching, and deposition operations. The conductive bus structures 270*a* and 270*b* may include a conductive material such as a tungsten material (W), a cobalt material (Co), a ruthenium material (Ru), a titanium material (Ti), a titanium nitride material (TiN), a tantalum material (Ta), a tantalum nitride material (TaN), an aluminum material (Al), a copper material (Cu), or a gold material (Au), among other examples of conductive materials.

As shown in FIG. 6, the conductive bus structures 270*a* and 270*b* (e.g., the electrical terminals 274*a* and 274*b*) are connected through a connection structure 602. Further, and as shown in FIG. 6, the conductive bus structures 272*a* and 272*b* (e.g., the electrical terminals 276*a* and 276*b*) are connected through a connection structure 604. The connection structures 602 and 604 may include a conductive material such as a tungsten material (W), a cobalt material (Co), a ruthenium material (Ru), a titanium material (Ti), a titanium nitride material (TiN), a tantalum material (Ta), a tantalum nitride material (TaN), an aluminum material (Al), a copper material (Cu), or a gold material (Au), among other examples of conductive materials.

As indicated above, FIG. 6 is provided as an example. Other examples may differ from what is described with regard to FIG. 6.

Figure 7:
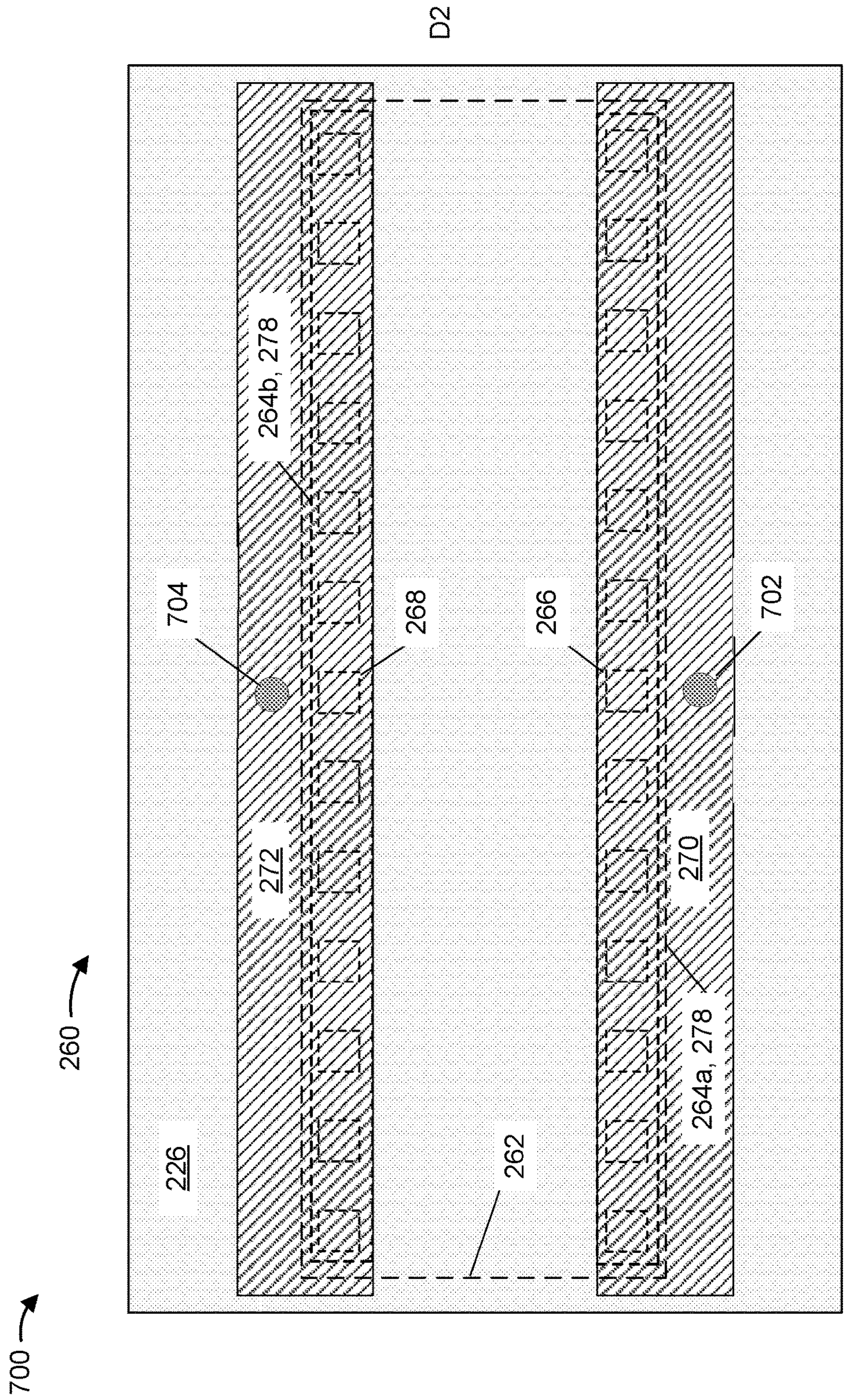
FIG. 7 is a diagram of an example implementation of a semiconductor resistor structure described herein.

FIG. 7 is a diagram of an example implementation 700 of a semiconductor resistor structure (e.g., the semiconductor resistor structure 260) described herein. In the top-down view of FIG. 7, the semiconductor resistor structure 260 includes an electrical terminal 702 that is part of the conductive bus structure 270. The electrical terminal 702 may correspond to an area (e.g., a land for a via structure) located at or near an edge of the conductive bus structure 270.

Additionally, or alternatively, the semiconductor resistor structure 260 includes an electrical terminal 704 that is part of the conductive bus structure 272. The electrical terminal 704 may correspond to an area (e.g., a land for a via structure) located at or near an edge of the conductive bus structure 272.

In an implementation where protrusions (e.g., the electrical terminals 274 and/or 276) may be prohibited due to layout constraints of the semiconductor resistor structure 260, a configuration including the electrical terminals 702 and/or 704 may be selected to distribute an electrical current throughout the semiconductor resistor structure 260.

In this way, a performance of a semiconductor device including the semiconductor resistor structure 260 is improved. Improving the performance of the semiconductor device may increase a manufacturing yield of the semiconductor device to a particular performance threshold, thereby reducing an amount of resources required to support a market that consumes a volume of the semiconductor device satisfying the particular performance threshold (e.g., semiconductor processing tools, labor, raw material, and/or computing resources).

As indicated above, FIG. 7 is provided as an example. Other examples may differ from what is described with regard to FIG. 7.

Figure 8:
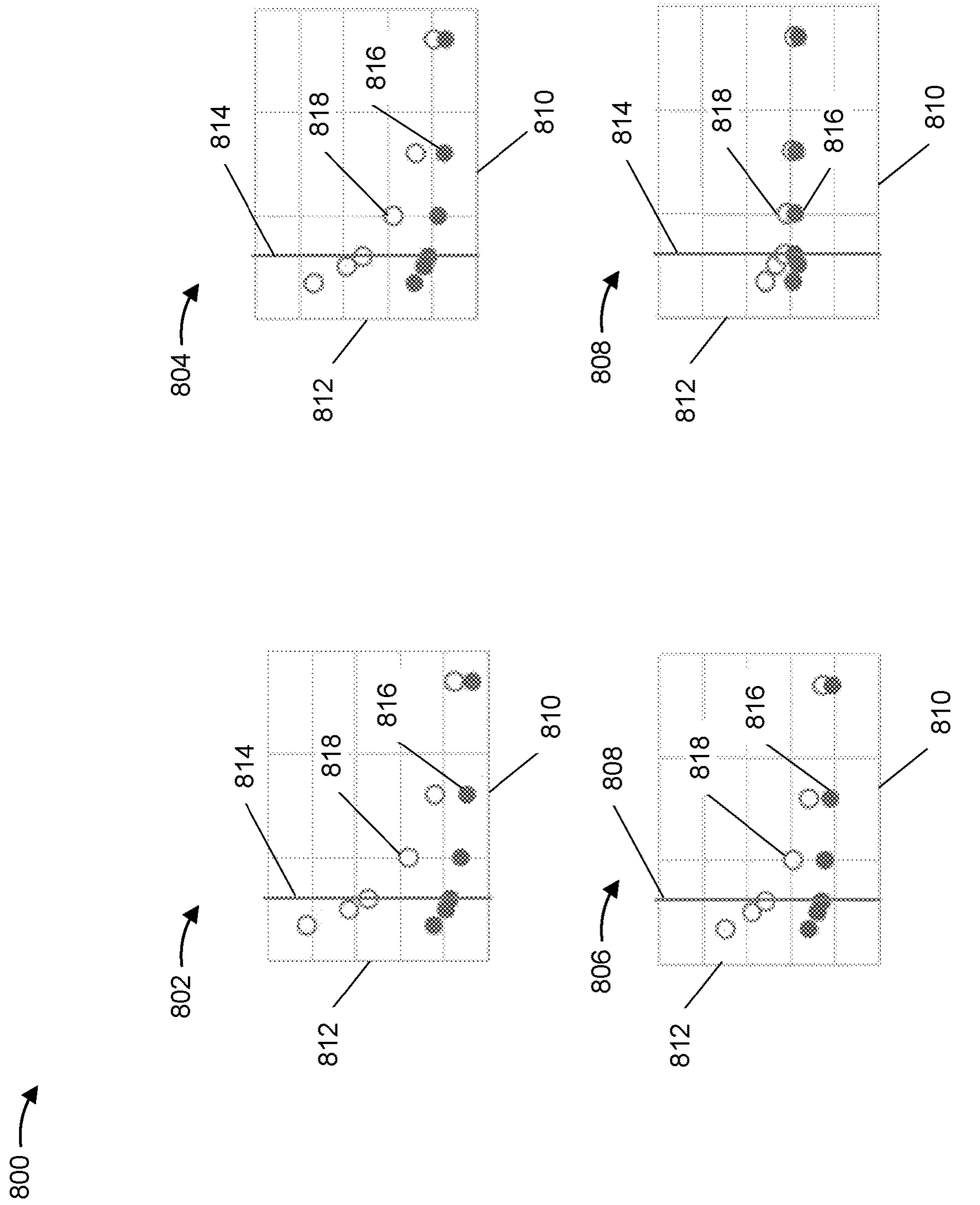
FIG. 8 is a diagram illustrating example performances related to variations of an example semiconductor resistor structure described herein.

FIG. 8 is a diagram 800 illustrating example performances (e.g., example performances 802-808) related to variations of an example semiconductor resistor structure (e.g., variation of the semiconductor resistor structure 260) described herein. The example performances illustrate variations in resistivities for different aspect ratios (e.g., length versus width) of the semiconductor resistor structure 260, which may correspond to D1:D3 as described in connection with FIG. 3.

In examples 802-808, axis 810 may illustrate an example width of the conductive bus structure 270 in microns (e.g., the width D3), and axis 812 may illustrate an example resistivity in ohms. The datum 814 may be a threshold corresponding to a minimum manufacturable width of the conductive bus structure 270 (e.g., 0.3 microns).

In the 802, the aspect ratio D1:D3 is approximately 20:1. The resistivities 816 (e.g., solid filled data points) may correspond to a configuration of the semiconductor resistor structure 260 including the electrical terminal 274 that is centrally located near an edge of the conductive bus structure 270. In contrast, the resistivities 818 (e.g., unfilled data points) may correspond to a configuration of the semiconductor resistor structure 260 having another electrical terminal (e.g., a routing pin) that is located near an end point of the conductive bus structure 270. As shown in example 802, and for the aspect ratio of approximately 20:1, a variation in the resistivities 816 may be lesser relative to a variation in the resistivities 818.

In the example 804, the aspect ratio D1:D3 is approximately 15:1. The resistivities 816 (e.g., solid filled data points) may correspond to a configuration of the semiconductor resistor structure 260 including the electrical terminal 274 that is centrally located near an edge of the conductive bus structure 270. In contrast, the resistivities 818 (e.g., unfilled data points) may correspond to a configuration of the semiconductor resistor structure 260 having another electrical terminal that is located near an end point of the conductive bus structure the conductive bus structure 270. As shown in the example 804, and for the aspect ratio of approximately 15:1, a variation in the resistivities 816 is lesser relative to a variation in the resistivities 818.

In the example 806, the aspect ratio D1:D3 is approximately 12:1. The resistivities 816 (e.g., solid filled data points) may correspond to a configuration of the semiconductor resistor structure 260 including the electrical terminal 274 that is centrally located near an edge of the conductive bus structure 270. In contrast, the resistivities 818 (e.g., unfilled data points) may correspond to a configuration of the semiconductor resistor structure 260 having another electrical terminal that is located near an end point of the conductive bus structure 270. As shown in the example 806, and for the aspect ratio of approximately 12:1, a variation in the resistivities 816 is lesser relative to a variation in the resistivities 818.

In the example 808, the aspect ratio D1:D3 is approximately 7:1. The resistivities 816 (e.g., solid filled data points) may correspond to a configuration of the semiconductor resistor structure 260 including the electrical terminal 274 that is centrally located near an edge of the conductive bus structure 270. In contrast, the resistivities 818 (e.g., unfilled data points) may correspond to a configuration of the semiconductor resistor structure 260 having another electrical terminal that is located near an end point of the conductive bus structure 270. As shown in example the 808, and for the aspect ratio of approximately 7:1, a variation in the resistivities 816 is lesser relative to a variation in the resistivities 818.

As indicated above, FIG. 8 is provided as an example. Other examples may differ from what is described with regard to FIG. 8.

Figure 9:
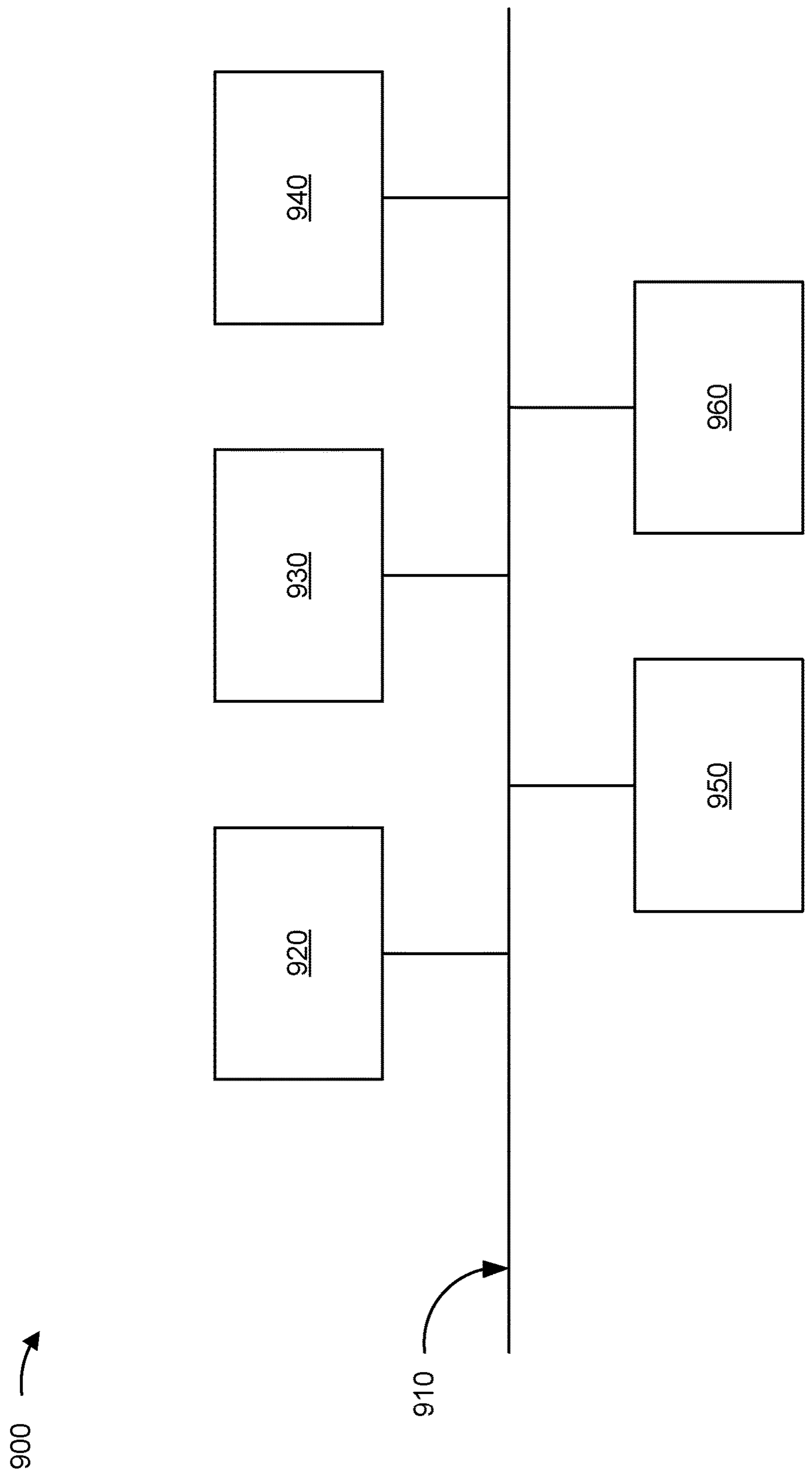
FIG. 9 is a diagram of example components of a device described herein.

FIG. 9 is a diagram of example components of a device 900 described herein. In some implementations, one or more of the semiconductor processing tools 102-112 and/or the wafer/die transport tool 114 may include one or more devices 900 and/or one or more components of the device 900. As shown in FIG. 9, the device 900 may include a bus 910, a processor 920, a memory 930, an input component 940, an output component 950, and/or a communication component 960.

The bus 910 may include one or more components that enable wired and/or wireless communication among the components of the device 900. The bus 910 may couple together two or more components of FIG. 9, such as via operative coupling, communicative coupling, electronic coupling, and/or electric coupling. For example, the bus 910 may include an electrical connection (e.g., a wire, a trace, and/or a lead) and/or a wireless bus. The processor 920 may include a central processing unit, a graphics processing unit, a microprocessor, a controller, a microcontroller, a digital signal processor, a field-programmable gate array, an application-specific integrated circuit, and/or another type of processing component. The processor 920 may be implemented in hardware, firmware, or a combination of hardware and software. In some implementations, the processor 920 may include one or more processors capable of being programmed to perform one or more operations or processes described elsewhere herein.

The memory 930 may include volatile and/or nonvolatile memory. For example, the memory 930 may include random access memory (RAM), read only memory (ROM), a hard disk drive, and/or another type of memory (e.g., a flash memory, a magnetic memory, and/or an optical memory). The memory 930 may include internal memory (e.g., RAM, ROM, or a hard disk drive) and/or removable memory (e.g., removable via a universal serial bus connection). The memory 930 may be a non-transitory computer-readable medium. The memory 930 may store information, one or more instructions, and/or software (e.g., one or more software applications) related to the operation of the device 900. In some implementations, the memory 930 may include one or more memories that are coupled (e.g., communicatively coupled) to one or more processors (e.g., processor 920), such as via the bus 910. Communicative coupling between a processor 920 and a memory 930 may enable the processor 920 to read and/or process information stored in the memory 930 and/or to store information in the memory 930.

The input component 940 may enable the device 900 to receive input, such as user input and/or sensed input. For example, the input component 940 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 950 may enable the device 900 to provide output, such as via a display, a speaker, and/or a light-emitting diode. The communication component 960 may enable the device 900 to communicate with other devices via a wired connection and/or a wireless connection. For example, the communication component 960 may include a receiver, a transmitter, a transceiver, a modem, a network interface card, and/or an antenna.

The device 900 may perform one or more operations or processes described herein. For example, a non-transitory computer-readable medium (e.g., memory 930) may store a set of instructions (e.g., one or more instructions or code) for execution by the processor 920. The processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, the processor 920 may be configured to perform one or more operations or processes described herein. Thus, implementations described herein are not limited to any specific combination of hardware circuitry and software.

The number and arrangement of components shown in FIG. 9 are provided as an example. The device 900 may include additional components, fewer components, different components, or differently arranged components than those shown in FIG. 9. Additionally, or alternatively, a set of components (e.g., one or more components) of the device 900 may perform one or more functions described as being performed by another set of components of the device 900.

Figure 10:
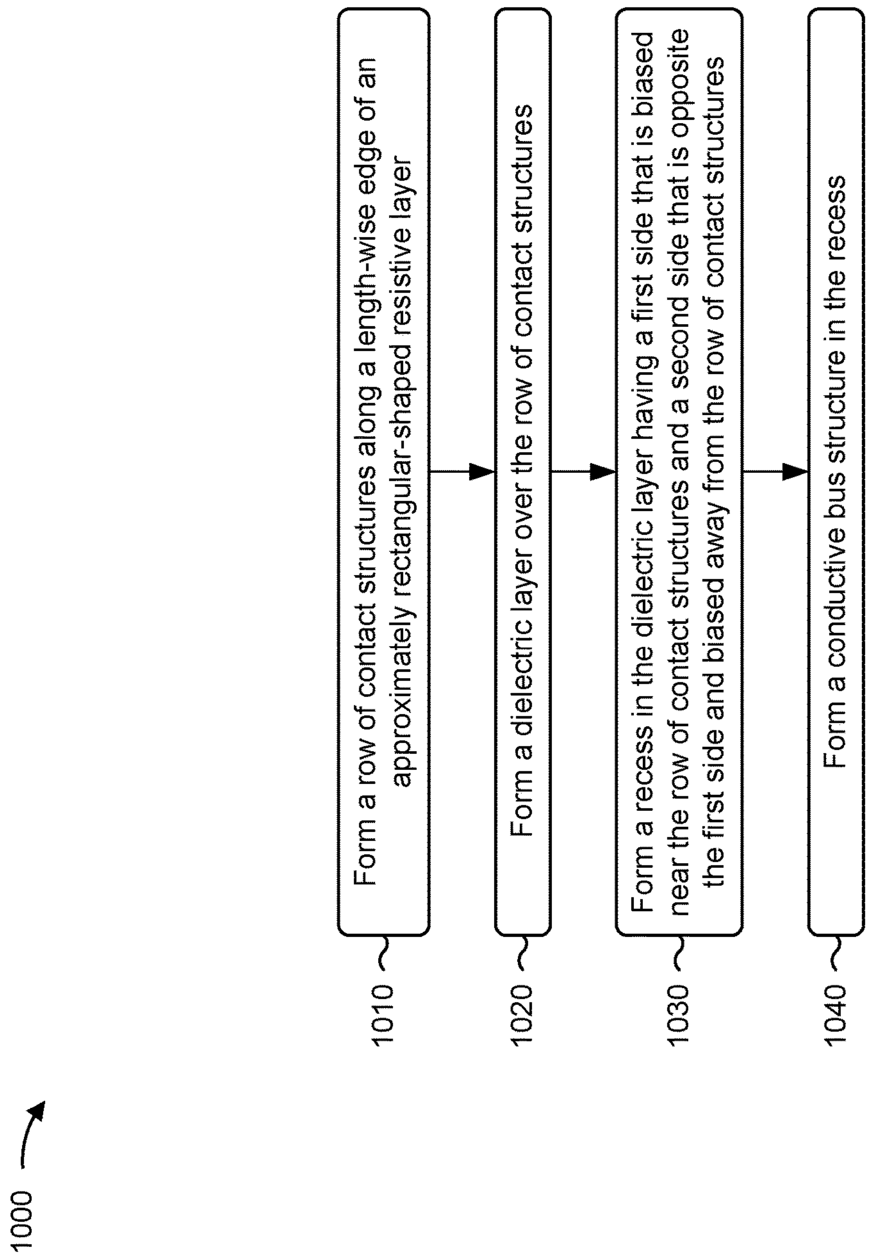
FIG. 10 is a flowchart of an example process associated with forming a semiconductor device including a semiconductor resistor structure described herein.

FIG. 10 is a flowchart of an example process 1000 associated with forming a semiconductor device (e.g., the semiconductor device 200) including a semiconductor resistor structure (e.g., the semiconductor resistor structure 260) described herein. In some implementations, one or more process blocks of FIG. 10 are performed by one or more semiconductor processing tools (e.g., one or more of the semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a row of contact structures along a length-wise edge of an approximately rectangular-shaped resistive layer (block 1010). For example, one or more of the semiconductor processing tools 102-112 may form a row of contact structures (e.g., the row of vias 266) along a length-wise edge of an approximately rectangular-shaped resistive layer (e.g., the resistive layer 262), as described herein.

As further shown in FIG. 10, process 1000 may include forming a dielectric layer over the row of contact structures (block 1020). For example, one or more of the semiconductor processing tools 102-112 may form a dielectric layer (e.g., the dielectric layer 226) over the row of contact structures, as described herein.

As further shown in FIG. 10, process 1000 may include forming a recess in the dielectric layer having a first side that is biased near the row of contact structures and a second side that is opposite the first side and biased away from the row of contact structures (block 1030). For example, one or more of the semiconductor processing tools 102-112 may form a recess (e.g., the recess 524) in the dielectric layer having a first side that is biased near the row of contact structures and a second side that is opposite the first side and biased away from the row of contact structures, as described herein. In some implementations, the recess exposes the row of contact structures.

As further shown in FIG. 10, process 1000 may include forming a conductive bus structure in the recess (block 1040). For example, one or more of the semiconductor processing tools 102-112 may form a conductive bus structure (e.g., the conductive bus structure 270) in the recess, as described herein. In some implementations, forming the conductive bus structure electrically connects the conductive bus structure to the approximately rectangular-shaped resistive layer through the row of contact structures.

Process 1000 may include additional implementations, such as any single implementation or any combination of implementations described below and/or in connection with one or more other processes described elsewhere herein.

In a first implementation, forming the recess includes forming an approximately rectangular-shaped recess, wherein the first side is a length-wise side of the approximately rectangular-shaped recess.

In a second implementation, alone or in combination with the first implementation, forming the recess includes forming a cavity (e.g., the cavity 528) that extends laterally from an approximate midpoint of the second side and away from the first side, and wherein forming the conductive bus structure includes forming an electrical terminal (e.g., the electrical terminal 274) in the cavity.

In a third implementation, alone or in combination with one or more of the first and second implementations, forming the conductive bus structure includes forming a first conductive bus structure (e.g., the conductive bus structure 270*a*) for a first thin film resistor structure (e.g., the semiconductor resistor structure 260*a*), and further comprising forming a second conductive bus structure (e.g., the conductive bus structure 270*b*) for a second thin film resistor structure (e.g., the semiconductor resistor structure 260*b*), and forming a connection structure (e.g., the connection structure 602) between the second conductive bus structure and the first conductive bus structure to connect, in electrical parallel, the second thin film resistor structure with the first thin film resistor structure.

In a fourth implementation, alone or in combination with one or more of the first through third implementations, forming the first conductive bus structure and forming the second conductive bus structure collectively comprises performing a deposition operation that concurrently forms the first conductive bus structure and the second conductive bus structure.

In a fifth implementation, alone or in combination with one or more of the first through fourth implementations, the deposition operation is a first deposition operation and forming the connection structure comprises performing a second deposition operation as part of forming the connection structure.

In a sixth implementation, alone or in combination with one or more of the first through fifth implementations, forming the first conductive bus structure, forming the second conductive bus structure, and forming the connection structure collectively includes performing a deposition operation that concurrently forms the first conductive bus structure, the second conductive bus structure, and the connection structure.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Some implementations described herein include techniques and apparatus for forming a semiconductor device including a semiconductor resistor structure. The semiconductor resistor structure (e.g., a low-impedance TFR structure) may include a resistive layer having an approximately rectangular shape (e.g., a length-to-width ratio that is less than approximately one). The semiconductor resistor structure includes contact structures connected to the resistive layer, a conductive bus structure having an approximately rectangular shape that connects to the contact structures, and an electrical terminal (e.g., a routing pin) centrally located at or near an edge of the conductive bus structure.

The centralized location of the electrical terminal, in combination with the approximately rectangular shape of the conductive bus structure, may improve a distribution of an electrical current throughout the semiconductor resistor structure relative to another semiconductor resistor structure that does not include the conductive bus structure having the approximately rectangular shape and/or the centrally located electrical terminal. Such an improved distribution of the electrical current may reduce a variation in resistance within the semiconductor resistor structure.

In this way, a performance of a semiconductor device including the semiconductor resistor structure is improved. Improving the performance of the semiconductor device may increase a manufacturing yield, of the semiconductor device, to a particular performance threshold, thereby reducing an amount of resources required to support a market that consumes a volume of the semiconductor device satisfying the particular performance threshold (e.g., semiconductor processing tools, labor, raw material, and/or computing resources).

As described in greater detail above, some implementations described herein provide a semiconductor resistor structure. The semiconductor resistor structure includes a resistive layer. The semiconductor resistor structure includes a row of contact structures located at or near an edge of the resistive layer. The semiconductor resistor structure includes a conductive bus structure that includes a first edge region connected to the row of contact structures, a second edge region that is opposite the first edge region, and an electrical terminal, where, in a top-down view of the semiconductor resistor structure, a location of the electrical terminal is at or near an approximate mid-axis of the row of contact structures and at or near the second edge region.

As described in greater detail above, some implementations described herein provide a semiconductor resistor structure. The semiconductor resistor structure includes a resistive layer. The semiconductor resistor structure includes a first conductive bus structure above and along a first edge of the resistive layer, where, in a top-down view of the semiconductor resistor structure, the first conductive bus structure has a first length. The semiconductor resistor structure includes a first row of contact structures between the first conductive bus structure and along the first edge of the resistive layer, where the first row of contact structures electrically connects the first conductive bus structure to the first edge of the resistive layer. The semiconductor resistor structure includes a second conductive bus structure above and along a second edge of the resistive layer, where the second edge is opposite the first edge, and where, in the top-down view of the semiconductor resistor structure, the second conductive bus structure has a second length. The semiconductor resistor structure includes a second row of contact structures between the second conductive bus structure and along the second edge of the resistive layer, where the second row of contact structures electrically connects the second conductive bus structure to the second edge of the resistive layer. In some implementations, and in a top-down view of the semiconductor resistor structure, a distance between the second row of contact structures and the first row of contact structures is lesser relative to the first length of the first conductive bus structure or the second length of the second conductive bus structure.

As described in greater detail above, some implementations described herein provide a method. The method includes forming a row of contact structures along a lengthwise edge of an approximately rectangular-shaped resistive layer. The method includes forming a dielectric layer over the row of contact structures. The method includes forming a recess in the dielectric layer having a first side that is biased near the row of contact structures and a second side that is opposite the first side and biased away from the row of contact structures, where the recess exposes the row of contact structures. The method includes forming a conductive bus structure in the recess, where forming the conductive bus structure electrically connects the conductive bus structure to the approximately rectangular-shaped resistive layer through the row of contact structures.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor resistor structure, comprising:
a resistive layer,
a row of contact structures located at or near an edge of the resistive layer,
wherein, in a top-down view of the semiconductor resistor structure, the row of contact structures extends along the edge of the resistive layer; and
a conductive bus structure comprising:
a first edge region over the edge of the resistive layer and connected to the row of contact structures;
a second edge region that is opposite the first edge region and parallel to the first edge region; and
an electrical terminal,
wherein, in the top-down view of the semiconductor resistor structure, a location of the electrical terminal is at or near an approximate mid-axis of the row of contact structures and at or near the second edge region, and
wherein a width of the electrical terminal is lesser relative to a length of the conductive bus structure.

2. The semiconductor resistor structure of claim 1, wherein the resistive layer comprises:
an approximately rectangular shape.

3. The semiconductor resistor structure of claim 1, wherein the electrical terminal is a protrusion that extends away from the second edge region of the conductive bus structure and away from a center of the resistive layer.

4. The semiconductor resistor structure of claim 3, wherein a width of the protrusion is greater than approximately 0.3 microns and a length of the protrusion is greater than approximately 0.14 microns.

5. The semiconductor resistor structure of claim 1, wherein the electrical terminal is an area of the second edge region that connects with a vertical interconnect access structure above the second edge region.

6. The semiconductor resistor structure of claim 1, wherein a width of the conductive bus structure is greater relative to a length of the conductive bus structure.

7. The semiconductor resistor structure of claim 1, wherein a length of the conductive bus structure is included in a range of approximately 0.3 microns to approximately 1.5 microns.

8. The semiconductor resistor structure of claim 1, wherein the conductive bus structure comprises:
a tungsten material,
a copper material,
a titanium material,
a titanium nitride material,
a tantalum material, or
a tantalum nitride material.

9. A semiconductor resistor structure, comprising:
a resistive layer;
a first conductive bus structure above and along a first edge of the resistive layer,
wherein, in a top-down view of the semiconductor resistor structure, the first conductive bus structure has a first length;
a first row of contact structures between the first conductive bus structure and along the first edge of the resistive layer,
wherein the first row of contact structures electrically connects the first conductive bus structure to the first edge of the resistive layer;

a second conductive bus structure above and along a second edge of the resistive layer, wherein the second edge is opposite the first edge, and wherein, in the top-down view of the semiconductor resistor structure, the second conductive bus structure has the first length; and a second row of contact structures between the second conductive bus structure and along the second edge of the resistive layer, wherein the second row of contact structures electrically connects the second conductive bus structure to the second edge of the resistive layer, and wherein, in the top-down view of the semiconductor resistor structure, a distance between the second row of contact structures and the first row of contact structures is lesser relative to the first length.

10. The semiconductor resistor structure of claim 9, wherein the resistive layer is a first resistive layer, the semiconductor resistor structure further comprising:

a second resistive layer;

a third conductive bus structure above and along a first edge of the second resistive layer; and a connection structure that connects the third conductive bus structure and the first conductive bus structure.

11. The semiconductor resistor structure of claim 10, further comprising:

a third row of contact structures between the third conductive bus structure and along the first edge of the second resistive layer, wherein the third row of contact structures electrically connects the third conductive bus structure to the first edge of the second resistive layer.

12. The semiconductor resistor structure of claim 9, wherein the resistive layer is a first resistive layer, the semiconductor resistor structure further comprising:

a second resistive layer;

a third conductive bus structure above and along a second edge of the second resistive layer; and a connection structure that connects the third conductive bus structure and the second conductive bus structure.

13. The semiconductor resistor structure of claim 9, wherein an impedance of the semiconductor resistor structure is less than approximately 50 ohms.

14. The semiconductor resistor structure of claim 9, wherein a variation of resistance across the semiconductor resistor structure is less than approximately 15%.

15. A method, comprising:

forming a row of contact structures along a length-wise edge of an approximately rectangular-shaped resistive layer;

forming a dielectric layer over the row of contact structures;

forming a recess in the dielectric layer having a first side that is biased near the row of contact structures and a second side that is opposite the first side and biased away from the row of contact structures, wherein the recess exposes the row of contact structures, wherein forming the recess includes forming a cavity that extends laterally from an approximate midpoint of the second side and away from the first side, and wherein a width of the cavity is lesser relative to a length of the recess; and forming a conductive bus structure in the recess, wherein forming the conductive bus structure electrically connects the conductive bus structure to the approximately rectangular-shaped resistive layer through the row of contact structures, and wherein forming the conductive bus structure comprises forming an electrical terminal in the cavity.

16. The method of claim 15, wherein forming the recess includes:

forming an approximately rectangular-shaped recess, wherein the first side is a length-wise side of the approximately rectangular-shaped recess.

17. The method of claim 15, wherein forming the conductive bus structure includes forming a first conductive bus structure for a first thin film resistor structure, and further comprising:

forming a second conductive bus structure for a second thin film resistor structure, and forming a connection structure between the second conductive bus structure and the first conductive bus structure to connect, in electrical parallel, the second thin film resistor structure with the first thin film resistor structure.

18. The method of claim 17, wherein forming the first conductive bus structure and forming the second conductive bus structure collectively comprises:

performing a deposition operation that concurrently forms the first conductive bus structure and the second conductive bus structure.

19. The method of claim 18, wherein the deposition operation is a first deposition operation and forming the connection structure comprises:

performing a second deposition operation as part of forming the connection structure.

20. The method of claim 17, wherein forming the first conductive bus structure, forming the second conductive bus structure, and forming the connection structure collectively includes:

performing a deposition operation that concurrently forms the first conductive bus structure, the second conductive bus structure, and the connection structure.

* * * * *